United States Patent
Tang et al.

(10) Patent No.: US 10,050,013 B2
(45) Date of Patent: Aug. 14, 2018

(54) PACKAGED SEMICONDUCTOR DEVICES AND PACKAGING METHODS

(71) Applicant: Taiwan Semiconductor Manufacturing Company, Ltd., Hsin-Chu (TW)

(72) Inventors: Tzu-Chun Tang, Kaohsiung (TW); Chuei-Tang Wang, Taichung (TW); Chun-Lin Lu, Hsin-Chu (TW); Wei-Ting Chen, Tainan (TW); Vincent Chen, Taipei (TW); Shou-Zen Chang, Panchiao (TW); Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 93 days.

(21) Appl. No.: 14/983,333

(22) Filed: Dec. 29, 2015

(65) Prior Publication Data

US 2017/0186726 A1 Jun. 29, 2017

(51) Int. Cl.
*H01L 23/58* (2006.01)
*H01L 25/065* (2006.01)
(Continued)

(52) U.S. Cl.
CPC .......... *H01L 25/065* (2013.01); *H01L 21/565* (2013.01); *H01L 23/3107* (2013.01);
(Continued)

(58) Field of Classification Search
CPC ... H01L 25/065; H01L 25/50; H01L 23/3107; H01L 23/58; H01L 23/5225; H01L 23/552; H01L 21/565; H01L 2225/06555; H01L 2225/06548; H01L 2225/06527; H01L 2225/06537; H01L 2223/6677; H01L 2224/023
See application file for complete search history.

(56) References Cited

U.S. PATENT DOCUMENTS 7,618,846 B1 * 11/2009 Pagaila ................. H01L 21/568
257/E21.599
8,361,842 B2 1/2013 Yu et al.
(Continued)

OTHER PUBLICATIONS

ASE Group, "Antenna on Package (AoP)," iMAPS San Diego, Jun. 2014 "Innovation in Sip: IC Packaging for the Next Big Thing," http://sdchapters.org/uploads/Rich_Rice_iMAPS_San_Diego_Luncheon_June_24_2014_shared.pdf, iMAPS San Diego, Jun. 2014, p. 24.

*Primary Examiner* — Michael Lebentritt
(74) *Attorney, Agent, or Firm* — Slater Matsil, LLP

(57) ABSTRACT

Packaged semiconductor devices and methods of packaging semiconductor devices are disclosed. In some embodiments, a packaged semiconductor device includes an integrated circuit die, a first molding material disposed around the integrated circuit die, and a through-via disposed within the first molding material. A first side of a redistribution layer (RDL) is coupled to the integrated circuit die, the through-via, and the first molding material. A second molding material is over a second side of the RDL, the second side of the RDL being opposite the first side of the RDL. The packaged semiconductor device includes an antenna over the second molding material.

20 Claims, 16 Drawing Sheets

(51) Int. Cl.
*H01L 21/56* (2006.01)
*H01L 23/31* (2006.01)
*H01L 25/00* (2006.01)

(52) U.S. Cl.
CPC .............. *H01L 23/58* (2013.01); *H01L 25/50* (2013.01); *H01L 2223/6677* (2013.01); *H01L 2225/06527* (2013.01); *H01L 2225/06548* (2013.01); *H01L 2225/06555* (2013.01)

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2009/0127716 A1* | 5/2009 | Takatsuki | H01L 21/561 257/777 |
| 2009/0206455 A1* | 8/2009 | Harper | H01L 23/3128 257/659 |
| 2011/0291288 A1 | 12/2011 | Wu et al. | |
| 2012/0086109 A1* | 4/2012 | Kim | H01L 21/561 257/659 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0262475 A1* | 9/2014 | Liu | H01L 25/50 174/377 |
| 2014/0264930 A1 | 9/2014 | Yu et al. | |
| 2016/0240492 A1* | 8/2016 | Wolter | H01L 23/552 |
| 2016/0329299 A1* | 11/2016 | Lin | H01L 23/5226 |
| 2017/0040266 A1* | 2/2017 | Lin | H01L 23/5383 |

\* cited by examiner

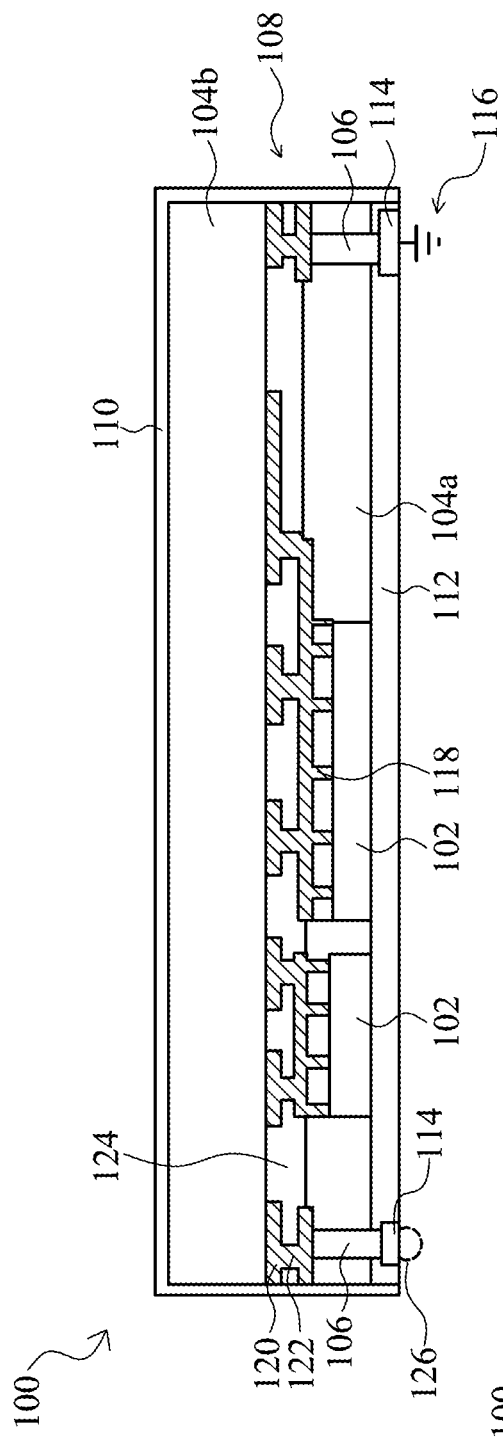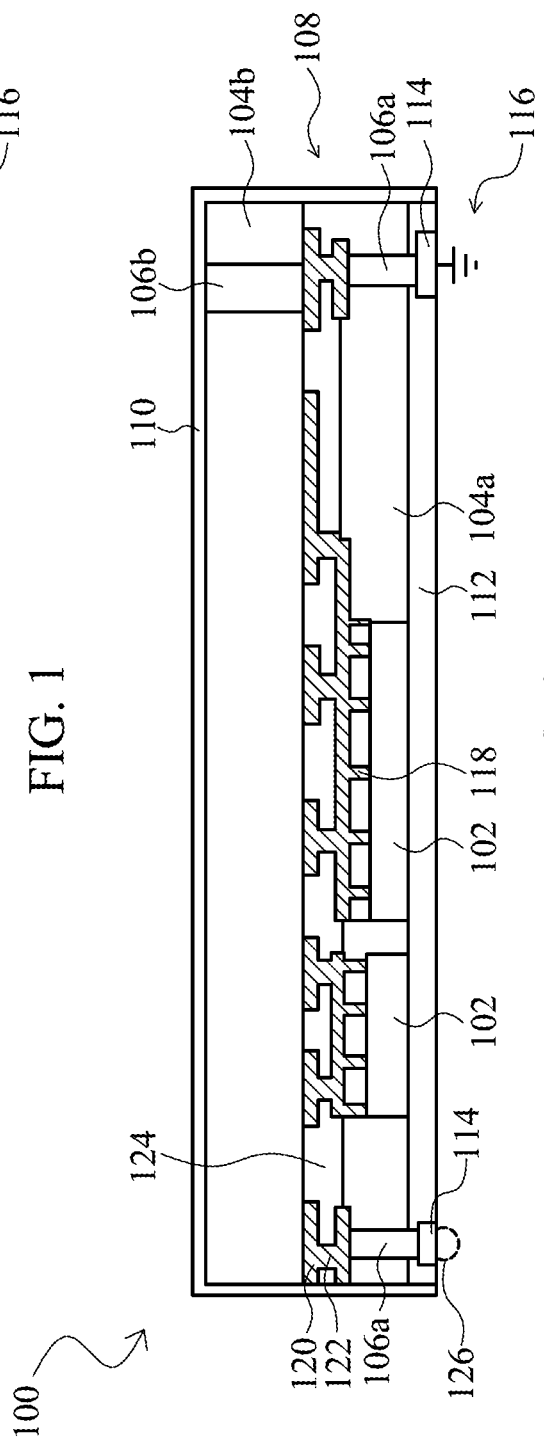

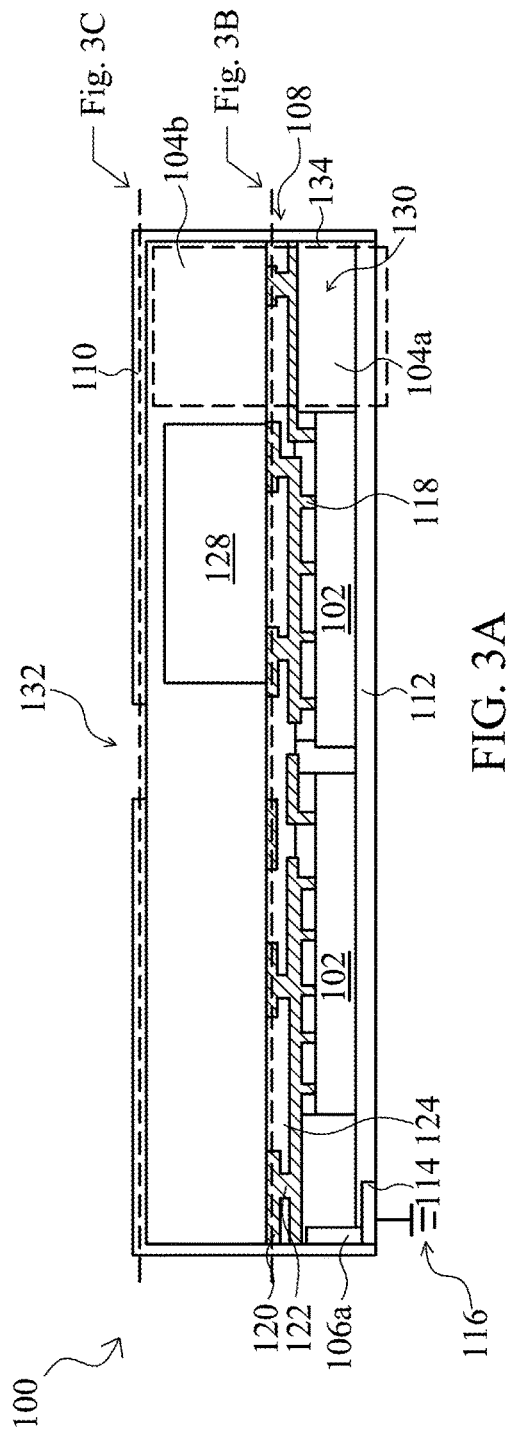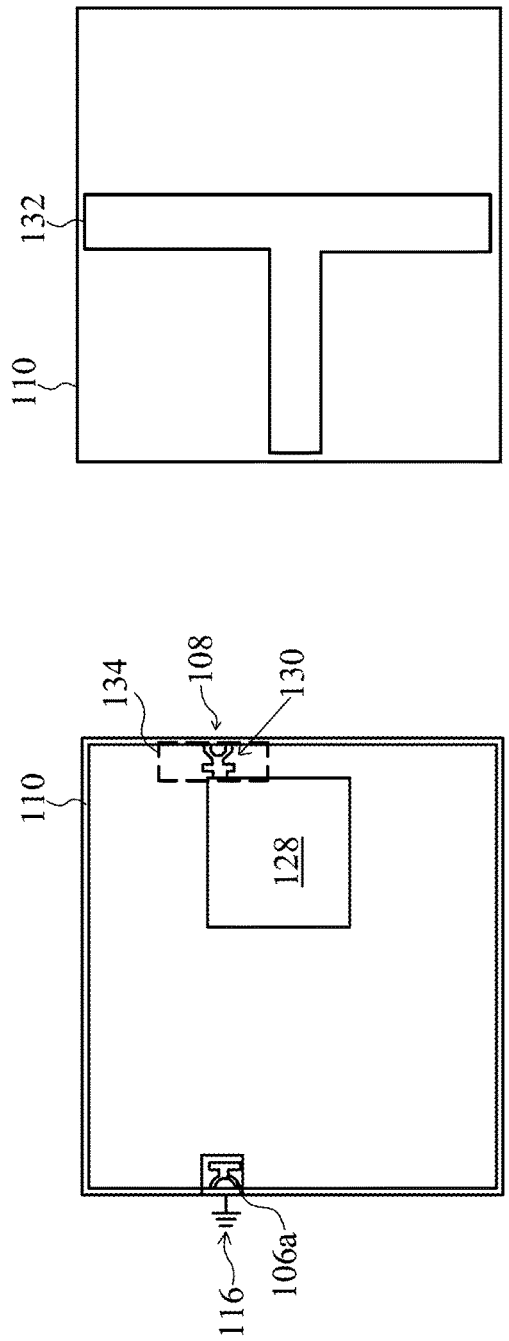

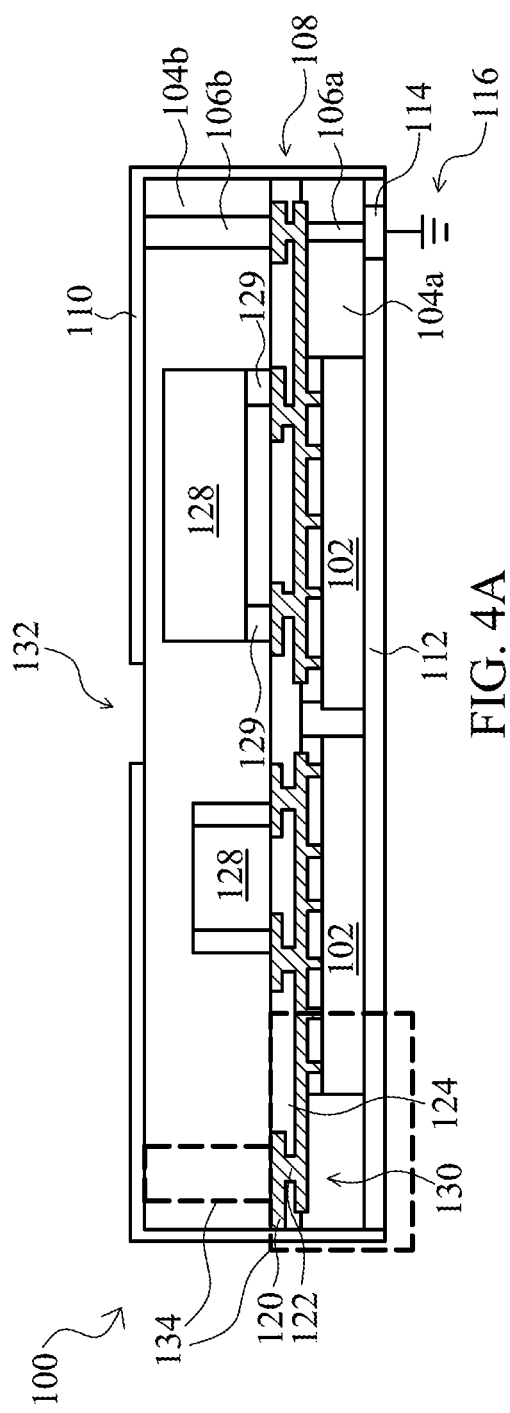
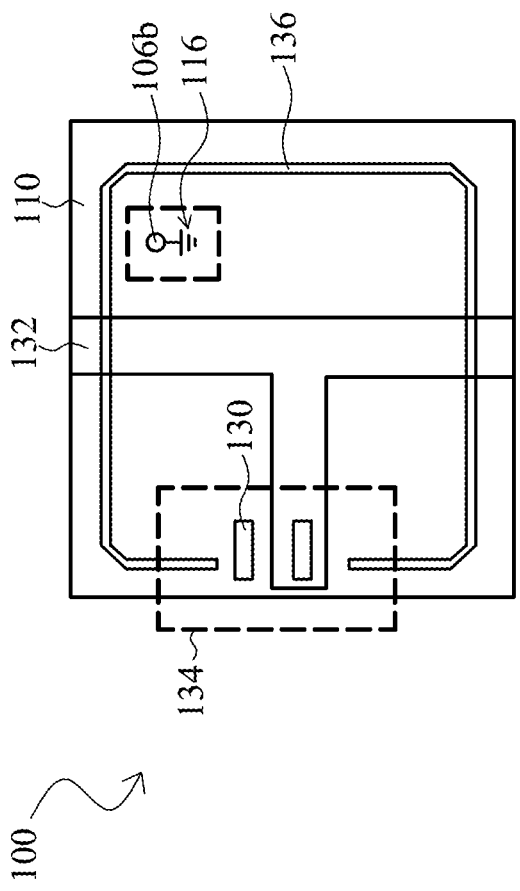
FIG. 4A
FIG. 4B

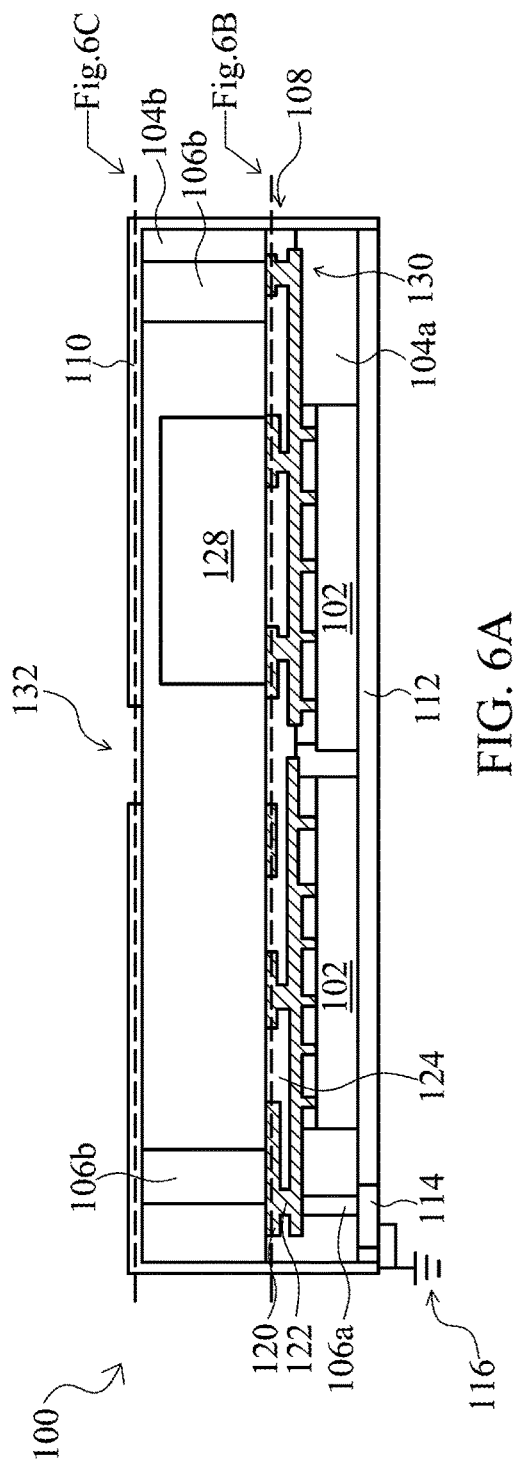
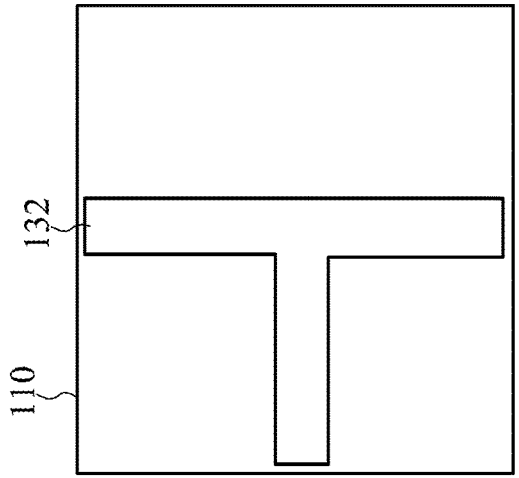
FIG. 6A
FIG. 6B
FIG. 6C

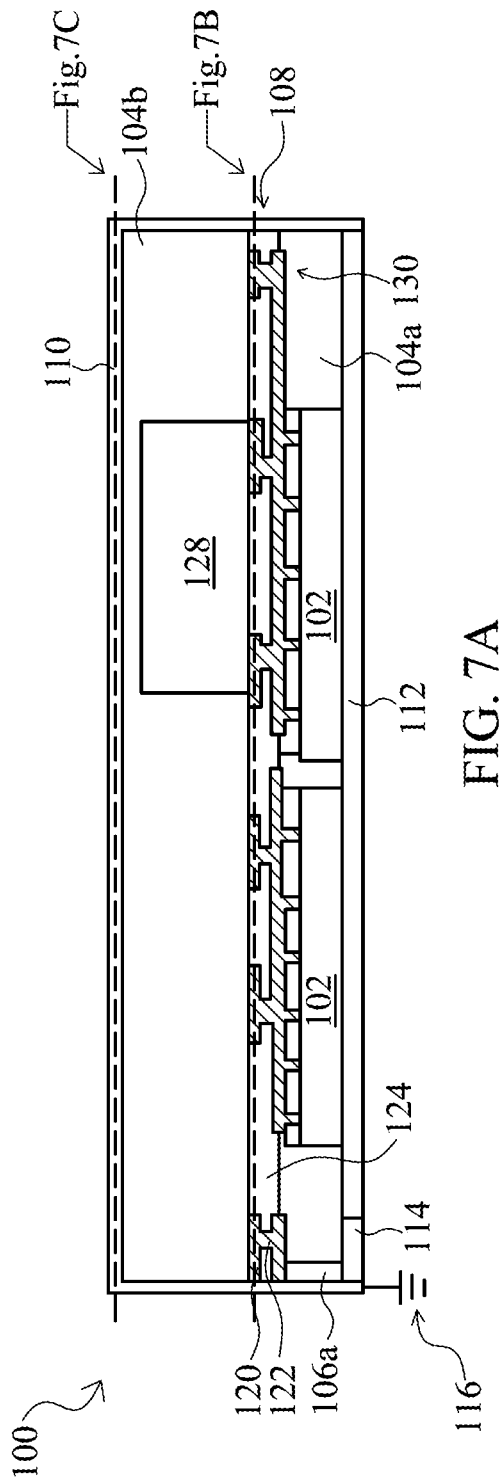
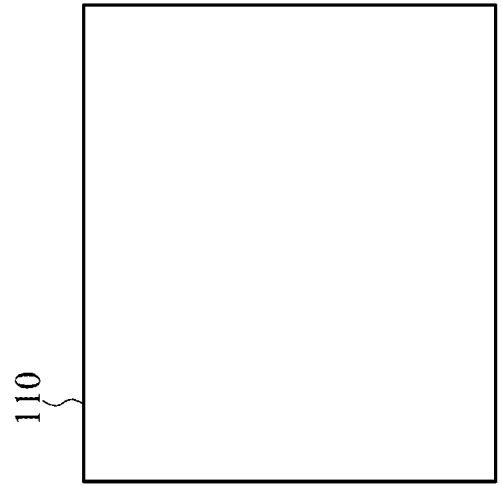
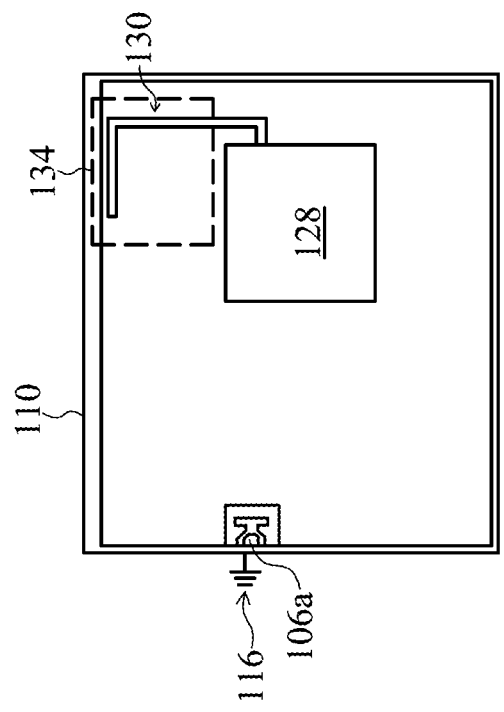
FIG. 7A
FIG. 7B
FIG. 7C

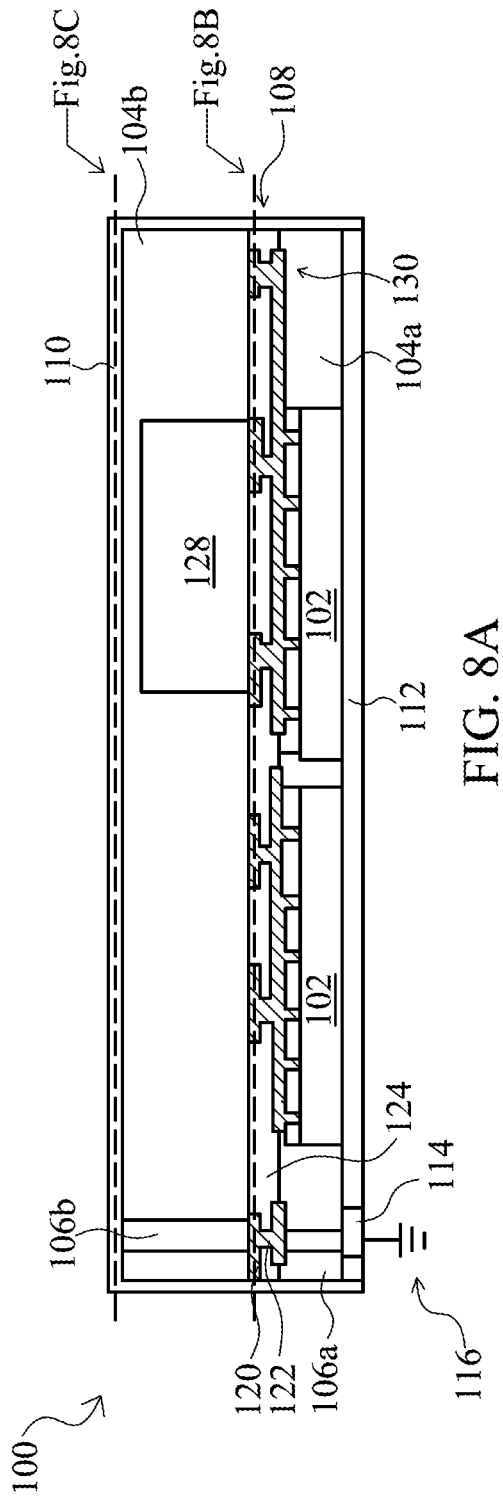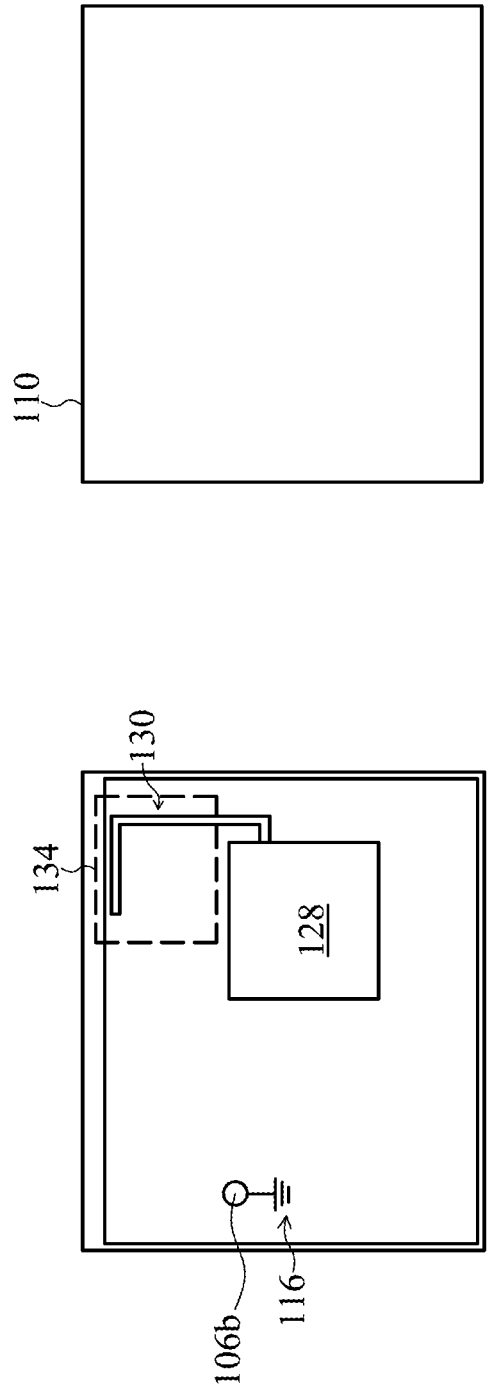

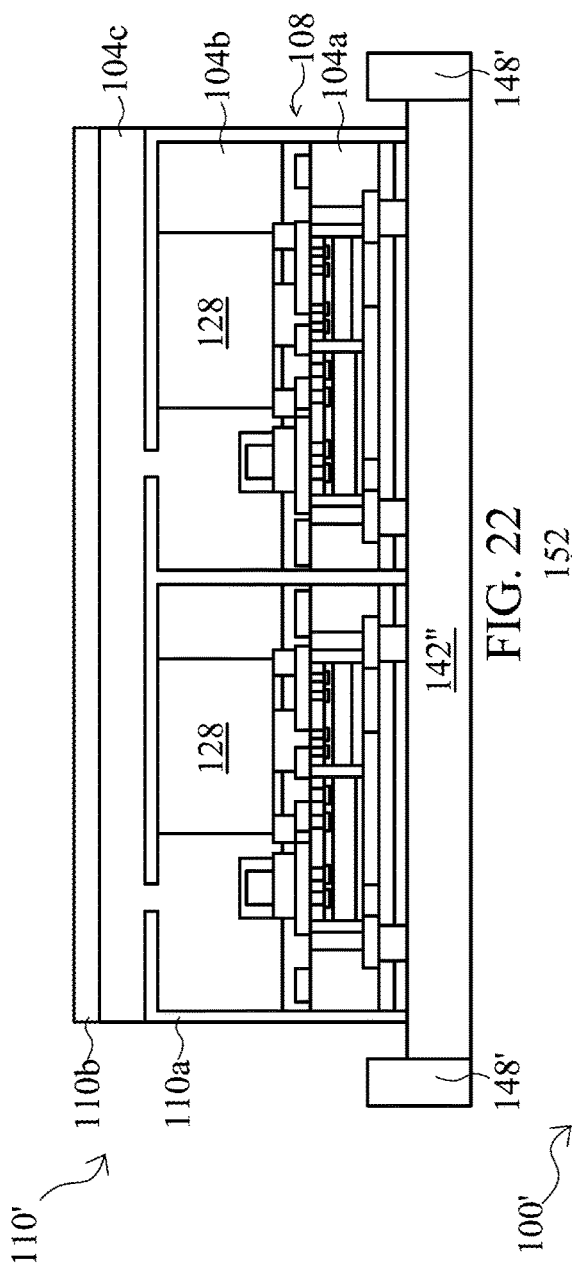
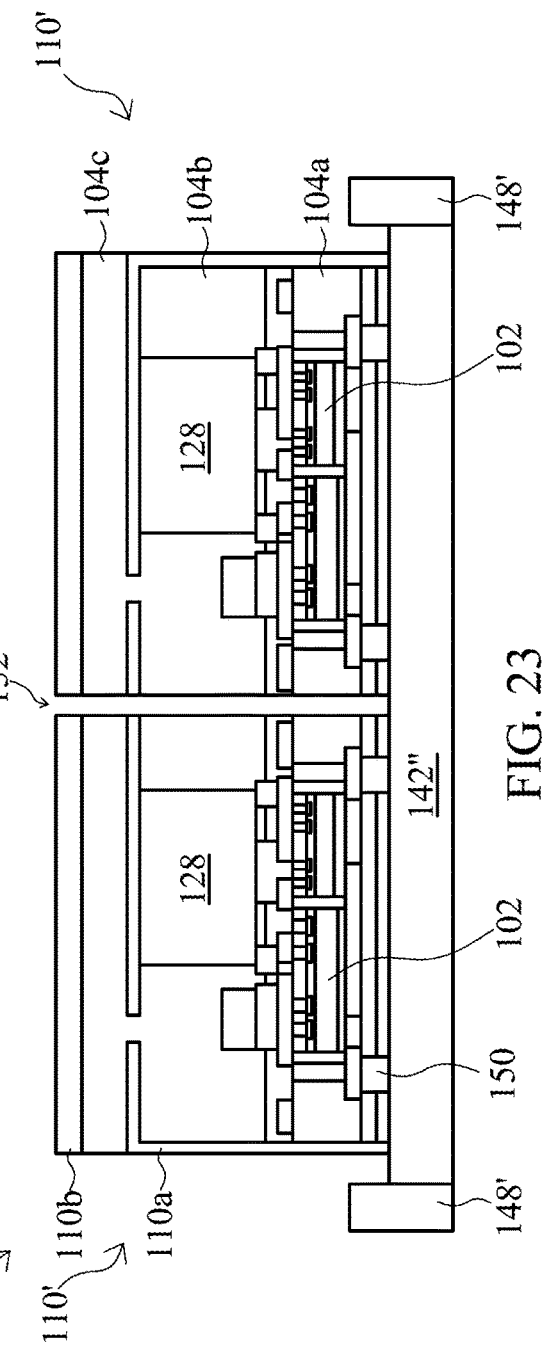

PACKAGED SEMICONDUCTOR DEVICES AND PACKAGING METHODS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post-passivation interconnect (PPI) that is used to fan-out wiring for contact pads of the package so that electrical contacts may be made on a larger pitch than contact pads of the integrated circuit. WLPs are often used to package integrated circuits (ICs) that demand high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 and 2 are cross-sectional views that illustrate packaged semiconductor devices that include an antenna in accordance with some embodiments of the present disclosure.

FIG. 3A is a cross-sectional view that illustrates a packaged semiconductor device that includes an antenna in accordance with some embodiments.

FIGS. 3B and 3C are top views showing portions of the packaged semiconductor device shown in FIG. 3A.

FIG. 4A is a cross-sectional view that illustrates a packaged semiconductor device that includes an antenna in accordance with some embodiments.

FIG. 4B is a top view showing a portion of the packaged semiconductor device shown in FIG. 4A.

FIG. 6A is a cross-sectional view that illustrates a packaged semiconductor device that includes an antenna in accordance with some embodiments.

FIGS. 6B and 6C are top views showing portions of the packaged semiconductor device shown in FIG. 6A.

FIG. 7A is a cross-sectional view that illustrates a packaged semiconductor device that includes an antenna in accordance with some embodiments.

FIGS. 7B and 7C are top views showing portions of the packaged semiconductor device shown in FIG. 7A.

FIG. 8A is a cross-sectional view that illustrates a packaged semiconductor device that includes an antenna in accordance with some embodiments.

FIGS. 8B and 8C are top views showing portions of the packaged semiconductor device shown in FIG. 8A.

FIGS. 21 through 23 are cross-sectional views that illustrate a method of packaging semiconductor devices at various stages in accordance with some embodiments.

DETAILED DESCRIPTION

Figure 5A:
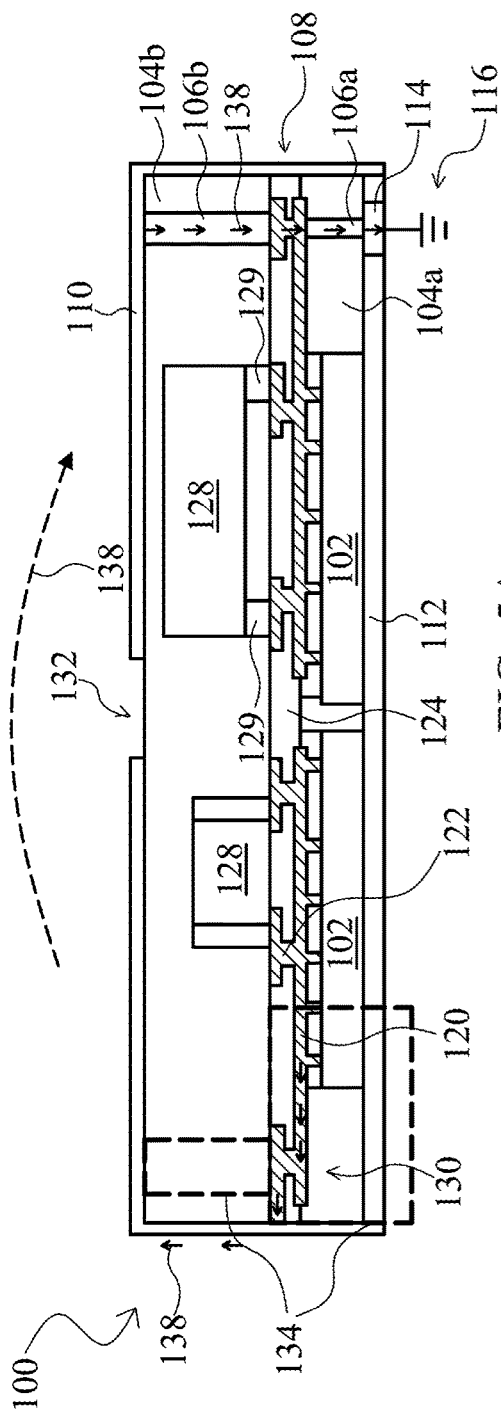
FIG. 5A is a cross-sectional view that illustrates a packaged semiconductor device that includes an antenna in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packaged semiconductor devices that include antennas and methods of packaging semiconductor devices are disclosed in the present disclosure. Throughout the various views and illustrative embodiments, like reference numerals are used to designate like elements. Several embodiments are first described wherein an antenna is included in a packaged semiconductor device, with reference to FIGS. 1 through 9D. Some exemplary packaging process flows in accordance with some embodiments will next be described with reference to FIGS. 10 through 20, FIGS. 21 through 23, and FIG. 24, in which some exemplary materials, dimensions, and formation methods of various elements of some embodiments are described.

FIGS. 1 and 2 are cross-sectional views that illustrate packaged semiconductor devices 100 that include an antenna 110 in accordance with some embodiments of the present disclosure. Referring first to FIG. 1, in some embodiments, a packaged semiconductor device 100 includes a plurality of integrated circuit dies 102 and a first molding material 104a disposed around and encapsulating the plurality of integrated circuit dies 102. Two integrated circuit dies 102 are shown in some of the drawings; however, one, two, or three or more integrated circuit dies 102 may be included in a packaged semiconductor device 100 in accordance with some embodiments. At least one through-via 106 is disposed within the first molding material 104a in some embodiments. A plurality of through-vias 106 is disposed within the first molding material 104a in some embodiments, for example. The plurality of through-vias 106 is also referred to herein as first through-vias 106 (or first through-vias 106a: see FIG. 2). The first through-vias 106 provide vertical electrical connections for the packaged semiconductor device 100 in some embodiments, for example. At least one of the first through-vias 106 provides a ground connection for an antenna 110 of the packaged semiconductor device 100 in some embodiments, which will be described further herein.

A redistribution layer (RDL) 108 is disposed over the plurality of integrated circuit dies 102, the first molding material 104a, and the first through-vias 106. The RDL 108 provides horizontal electrical connections for the packaged semiconductor device 100 in some embodiments. The RDL 108 comprises an interconnect structure that includes fan-out wiring for the packaged semiconductor device 100 in some embodiments, for example. Contact pads of the fan-out wiring are arranged on a larger footprint of contacts 118 of the integrated circuit dies 102, for example. A second molding material 104b is disposed over the RDL 108.

An antenna 110 is disposed over the second molding material 104b in some embodiments. The antenna 110 comprises a metal that is conformally coated over the top surface of the second molding material 104b and over sidewalls of the second molding material 104b, the RDL 108, and the first molding material 104a in some embodiments. The structure of the antenna 110 advantageously integrates a conformal coating process into the packaging process flow, which reduces the package height and cost, and which also increases flexibility of the design of the antenna 110.

In some embodiments, before the first molding material 104a is formed, the plurality of integrated circuit dies 102 and the first through-vias 106 are coupled to and/or formed over an insulating material 112. A plurality of contact pads 114 are formed within or over a surface of the insulating material 112 in some embodiments, for example. At least one of the contact pads 114 (e.g., the contact pad 114 on the right side in the view shown in FIG. 1) is coupled to (i.e., connected to in some embodiments) a ground connection 116. The contact pad 114 is connected to a conductive portion of the RDL 108 such as one or more conductive lines 120 and vias 122 by one of the first through-vias 106. The RDL 108 is coupled to a portion of the antenna 110, i.e., to a sidewall of the antenna 110 in the view shown in FIG. 1. In some embodiments, the insulating material 112 comprises a ground contact (e.g., contact pad 114 connected to the ground connection 116) disposed thereon, and one of the first through-vias 106 is connected to the ground contact. The contacts 126 may be used to electrically couple the packaged semiconductor device 100 to another device or in an end application, as examples.

The integrated circuit dies 102 include a plurality of contacts 118 disposed on a surface thereof. The contacts 118 may be disposed within an insulating material layer. The contacts 118 are connected to conductive features of the RDL 108, such as conductive lines 120 and/or conductive vias 122 which are formed within one or more insulating material layers 124 of the RDL 108. Connectors 126, shown in phantom (e.g., in dashed lines) in FIG. 1, are coupled to at least some of the contact pads 114 in some embodiments.

FIG. 2 illustrates some embodiments wherein the plurality of through-vias 106a disposed in the first molding material 104a comprise first through-vias 106a, and wherein at least one second through-via 106b is disposed within the second molding material 104b. One second through-via 106b is shown in FIG. 2. A plurality of second through-vias 106b may also be formed in the second molding material 104b. In some embodiments, one end (i.e., the top end in FIG. 2) of the second through-via 106b is coupled to (i.e., directly connected to, in some embodiments) the antenna 110, and an opposite end (i.e., the bottom end in FIG. 2) of the second through-via 106b is connected to a conductive portion of the RDL 108. The conductive portion of the RDL 108 is connected to at least one of the first through-vias 106a, which is connected to a ground connection 116 by a contact pad 114 within or disposed on or over the insulating material 112. A conductive portion of the RDL 108 is not directly coupled to the antenna 110 in some embodiments, for example.

A feeding element for the antenna 110 is formed in the RDL 108, within the molding materials 104a or 104b, or within both in the RDL 108 and within the molding materials 104a or 104b in some embodiments, which is not illustrated in FIGS. 1 and 2 and which will be described further herein. The antenna 110 is patterned in some embodiments. The antenna 110 is unpatterned in other embodiments. One or more devices may be coupled to an opposite side of the RDL 108 that the plurality of integrated circuit dies 102 are coupled to in some embodiments.

FIG. 3A is a cross-sectional view that illustrates a packaged semiconductor device 100 that includes an antenna 110 in accordance with some embodiments. FIGS. 3B and 3C are top views showing portions of the packaged semiconductor device 100 shown in FIG. 3A, proximate the RDL 108 and the top surface of the antenna 110, respectively. One or more surface mount devices 128 is connected to the RDL 108. The second molding material 104b is disposed around the surface mount device(s) 128 and encapsulates the surface mount device(s) 128. The surface mount device(s) 128 comprise components that are adapted to communicate with and/or control functions of the antenna 110 in some embodiments, for example.

The antenna 110 is patterned in some of the embodiments shown, as illustrated in FIGS. 3A and 3C. After the antenna 110 material is formed over the top surfaces and sidewalls of the second molding material 104b, the antenna 110 material may be patterned using a laser patterning process, a laser drilling process, or a laser grooving process, as examples. The antenna 110 material may also be patterned using other methods, such as a lithography process or other methods. The antenna 110 material includes one or more apertures 132 formed therein, as illustrated in FIG. 3A in the cross-sectional view and in FIG. 3C in the top view. The shape of the pattern in the antenna 110 shown in FIG. 3C is an example: the pattern in the antenna 110 may also comprise other shapes.

The antenna 110 is grounded on one side (i.e., on the left side in FIG. 3A) by a first through-via 106a that is connected to a ground connection 116 by a contact pad 114 disposed within insulating material 112. The antenna 110 is disposed over a sidewall of the first molding material 104a, and the first through-via 106a is connected to a portion of the antenna 110 disposed over the sidewall of the first molding material 104a, for example. A portion of the RDL 108 is also adjacent to and is directly coupled to the antenna 110. The antenna 110 is grounded using the RDL 108, the first through-via 106a, and a contact pad 114 in some of the embodiments shown, for example.

The packaged semiconductor device 100 includes a feeding element 130 for the antenna 110 which is disposed within the RDL 108, as illustrated on the right side of FIG. 3A and in the top view shown in FIG. 3B. The feeding element 130 is formed in a conductive material layer of the RDL 108, such as in a conductive line 120 layer of the RDL 108, in some embodiments. The feeding element 130 is directly coupled to the antenna 110 in some of the embodiments illustrated in FIGS. 3A and 3B. For example, the feeding element 130 is disposed adjacent the antenna 110 on the sidewall of the RDL 108. The feeding element 130 formed in the RDL 108 is electrically and mechanically coupled to the antenna 110 in some of the embodiments shown in FIGS. 3A through 3C, for example. In some embodiments, the feeding element 130 is disposed proximate the antenna 110 yet is not attached to the antenna 110, which will be described further herein.

In some embodiments, a clear zone 134 is disposed proximate the feeding element 130. The clear zone 134 comprises a clearance area proximate the feeding element 130 for the antenna 110 wherein components or routing is not formed in the packaged semiconductor device 100. The clear zone 134 advantageously prevents or reduces interference with transmission of the feeding element 130 and/or antenna 110 in some embodiments, for example. First through-vias 106a and/or second through-vias 106b (see FIG. 2) are not formed or disposed in the clear zone 134 proximate the feeding element 130 in some embodiments, for example. Interconnect routing of the RDL 108 such as conductive lines 120 and conductive vias 122 are not formed or disposed in the clear zone 134 proximate the feeding element 130 in some embodiments, as another example. Likewise, integrated circuit dies 102 and surface mount devices 128 are not formed or disposed in the clear zone 134 proximate the feeding element 130 in some embodiments.

In some embodiments, the antenna 110 is grounded on one side, and the feeding element 130 is formed on an opposite side of the antenna 110 from wherein the antenna 110 is grounded. The feeding element 130 may also be formed on other locations of the antenna 110 relative to the grounded region of the antenna 110, for example.

FIG. 4A is a cross-sectional view that illustrates a packaged semiconductor device 100 that includes an antenna 110 in accordance with some embodiments. FIG. 4B is a top view showing a portion of the packaged semiconductor device shown in FIG. 4A, proximate the RDL 108 and the top surface of the antenna 110.

A feeding element 130 formed in the RDL 108 and a clear zone 134 proximate the feeding element 130 are illustrated. The antenna 110 is disposed over a surface (e.g., a top surface and sidewalls) of the second molding material 104b.

A second through-via 106b is disposed within the second molding material 104b. The second through-via 106b is coupled to a portion of the antenna 110 disposed over the top surface of the second molding material 104b; e.g., the top end of the second through-via 106 is coupled to the antenna 110. The second through-via 106b is coupled to the first through-via 106a by a portion of the RDL 108. The first through-via 106a is coupled to a contact pad 114 that is coupleable to a ground connection 116. Thus, the antenna 110 is grounded by the second through-via 106b, a portion of the RDL 108, the first through-via 106a, and the contact pad 114.

FIG. 4B also illustrates a seal ring 136 that may be formed in some embodiments proximate a perimeter of the packaged semiconductor device 100. The seal ring 136 may be formed in one or more conductive material layers of the RDL 108, for example. The seal ring 136 may also be disposed in other material layers of the packaged semiconductor device 100, such as within the first molding material 104a and/or the second molding material 104b. The seal ring 136 strengthens the packaged semiconductor device 100, provides increased robustness to the packaged semiconductor device 100, and prevents or reduces damage during a subsequent singulation process to separate a plurality of the packaged semiconductor devices 100 that are simultaneously packaged from one another in some embodiments, for example. In some embodiments, a seal ring 136 is not included. The antenna 110 is disposed around the seal ring 136 and is separated from the seal ring 136 by an insulating material 124 of the RDL 108, the first molding material 104a, and/or the second molding material 104b.

Figure 5B:
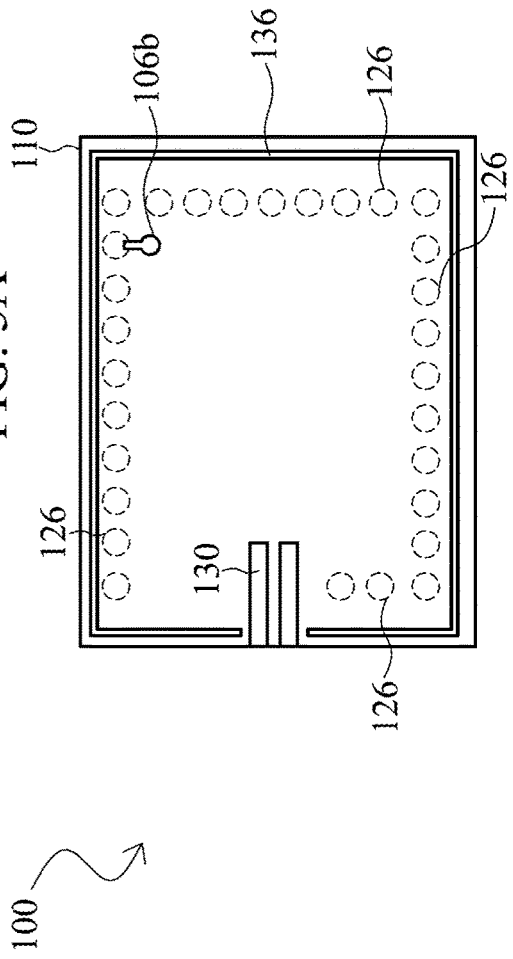
FIG. 5B is a top view showing a portion of the packaged semiconductor device shown in FIG. 5A.

FIG. 5A is a cross-sectional view that illustrates a packaged semiconductor device 100 that includes an antenna 110 in accordance with some embodiments. FIG. 5B is a top view showing a portion of the packaged semiconductor device 100 shown in FIG. 5A in accordance with some embodiments. A signal or transmission path 138 is illustrated, with the signal emitting from the feeding element 130 to the antenna 110 and returning through a grounding path.

FIG. 5B also illustrates in phantom an arrangement of a plurality of connectors 126 on a bottom surface of the packaged semiconductor device 100 in accordance with some embodiments. A connector 126 and/or through-via 106a (see FIG. 5A) may be connected to each of the contact pads 114 disposed on or within insulating material 112 (see also FIG. 5A), for example. The contact pads 114, through-vias 106a, and connectors 126 may be disposed in a single row or in multiple rows along edges of the packaged semiconductor device 100 in some embodiments, for example. The contact pads 114, through-vias 106a, and connectors 126 may also be arranged in a ball grid array (BGA) in rows and columns, or in random shapes, for example, not shown. FIG. 5B also illustrates the seal ring 136 shown and described for FIG. 4B, for example.

FIG. 6A is a cross-sectional view that illustrates a packaged semiconductor device 100 that includes an antenna 110 in accordance with some embodiments of the present disclosure. FIGS. 6B and 6C are top views showing portions of the packaged semiconductor device 100 shown in FIG. 6A, proximate the RDL 108 and the top surface of the antenna 110, respectively. The feeding element 130 is directly connected to the antenna 110 by a second through-via 106b. A clear zone 134 is disposed proximate the feeding element 130, as shown in FIG. 6B. The antenna 110 is grounded by a second through-via 106b disposed within the second molding material 104b, a portion of the RDL 108, a first through-via 106a disposed within the first molding material

104*a*, and a contact pad 114 that is connected to a ground connection 116. The antenna 110 is grounded through the left-most second through-via 106*b*, a portion of the RDL 108, a first through-via 106*a*, a contact pad 114, and then to the ground connection 116.

The feeding element 130 is formed in a portion of the RDL 108 and also includes a second through-via 106*b*. A clear zone 134 (see FIG. 6B) is disposed proximate the feeding element 130. The second through-via 106*b* of the feeding element 130 is directly attached or coupled to the antenna 110 at a top surface of the second molding material 104*b* in the view shown in FIG. 6A.

In some of the embodiments shown in FIGS. 3A through 3C, 4A and 4B, 5A and 5C, and 6A through 6C, the feeding element 130 is directly attached to or is coupled to the antenna 110. The feeding element 130 comprises a first portion formed in a portion of the RDL 108 and a second portion that comprises a second through-via 106*b*, for example. Thus, the feeding element 130 comprises a horizontal portion in the RDL 108 and a vertical portion comprising the second through-via 106*b*. The antenna 110 may be grounded through a portion of the RDL 108, a first through-via 106*a*, a portion of the RDL 108 and a first through-via 106*a*, a second through-via 106*b* coupled to a portion of the RDL 108, or a second through-via 106*b* coupled to a first through-via 106*a* by a portion of the RDL 108, as examples.

In some embodiments of the present disclosure, the feeding element 130 is disposed proximate the antenna 110, and the feeding element 130 is not directly attached to the antenna 110. For example, FIG. 7A is a cross-sectional view that illustrates a packaged semiconductor device 100 that includes an antenna 110 in accordance with some embodiments. The antenna 110 is disposed proximate the feeding element 130. FIGS. 7B and 7C are top views showing portions of the packaged semiconductor device 100 shown in FIG. 7A, proximate the RDL 108 and the top surface of the antenna 110, respectively.

The feeding element 130 is formed in one or more conductive material layers of the RDL 108, such as a conductive line 120 layer. The feeding element 130 may comprise a substantially straight line in a top view or may comprise a meandering shape, as illustrated in FIG. 7B in the top view. A clear zone 134 shown in FIG. 7B is disposed proximate the feeding element 130. The feeding element 130 may comprise a width in a top view of about 10 µm or greater and a length in the top view of about 1 mm or greater, in some embodiments. The feeding element 130 may also comprise other dimensions, such as having a width of about 10 µm or less and a length of about 1 mm or less, as examples. The feeding element 130 is spaced apart in a horizontal and/or vertical direction from the antenna 110 by a distance of about 200 µm or greater in some embodiments. In some embodiments, the feeding element 130 may be spaced apart from the antenna 110 by other amounts, such as by about 200 µm or less, for example.

In some embodiments, the antenna 110 is not patterned, as illustrated in FIG. 7A in a cross-sectional view and in FIG. 7C in a top view. The antenna 110 comprises a continuous sheet or material layer of a conductive material in some embodiments. The antenna 110 may also be patterned in some of the embodiments illustrated in FIGS. 7A through 7C, as illustrated in FIGS. 3A, 3C, 4A, 4B, 5A, 6A, and 6C, as examples.

FIG. 8A is a cross-sectional view that illustrates a packaged semiconductor device 100 that includes an antenna 110 in accordance with some embodiments. FIGS. 8B and 8C are top views showing portions of the packaged semiconductor device 100 shown in FIG. 8A, proximate the RDL 108 and the top surface of the antenna 110, respectively. The antenna 110 is also not patterned in some of the embodiments shown in FIGS. 8A through 8C. In some embodiments, the antenna 110 may also be patterned in the embodiments shown in FIGS. 8A through 8C, as illustrated in FIGS. 3A, 3C, 4A, 4B, 5A, 6A, and 6C, as examples.

The grounding of the antenna 110 is achieved by a second through-via 106*b* directly connected to a portion of the RDL 108, which portion of the RDL 108 is connected to a first through-via 106*a*, which first through-via 106*a* is connected to a contact pad 114 that is connected to a ground connection 116, similar to some of the embodiments illustrated in FIGS. 2, 4A and 4B, 5A and 5B, and 6A through 6C.

The feeding element 130 is formed in a portion of the RDL 108 and is not directly coupled to the antenna 110, as shown and described for some of the embodiments shown in FIGS. 7A through 7C. Rather, the feeding element 130 is disposed proximate the antenna 110 yet is spaced apart from the antenna 110 by a predetermined distance.

Figure 9A:
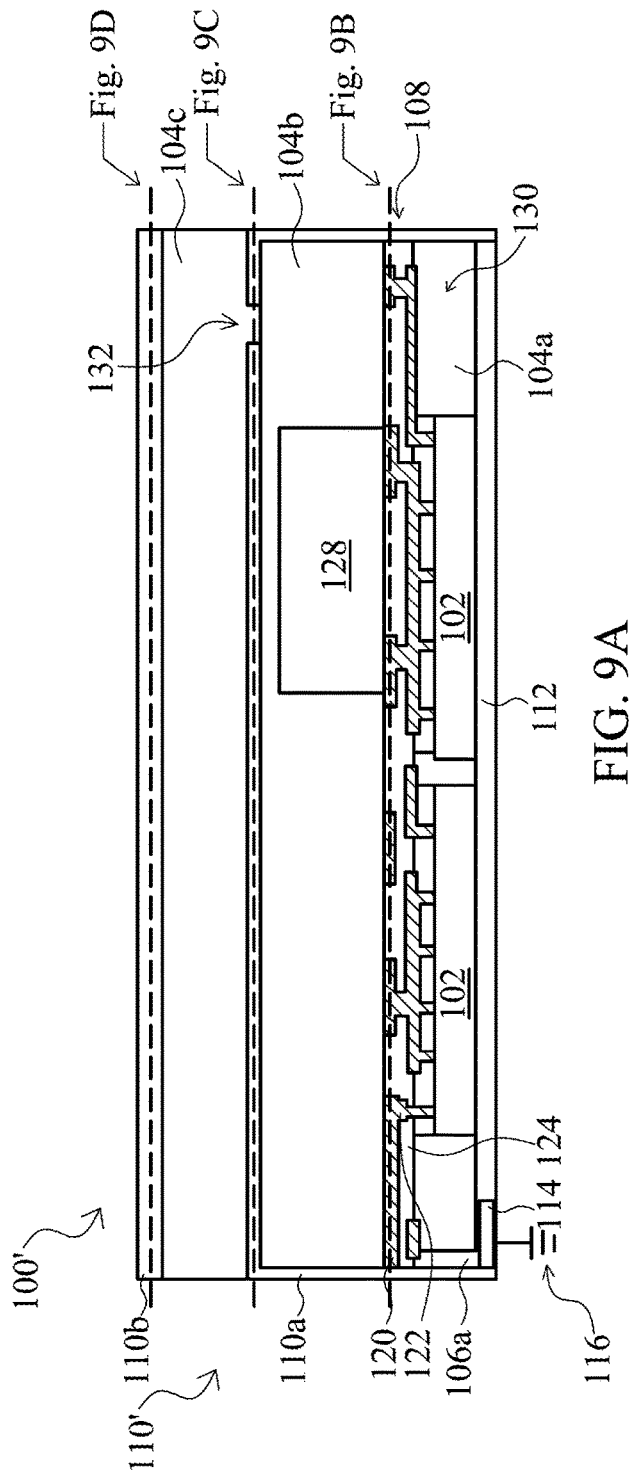
FIG. 9A is a cross-sectional view that illustrates a packaged semiconductor device that includes an antenna in accordance with some embodiments.
Figure 9B:
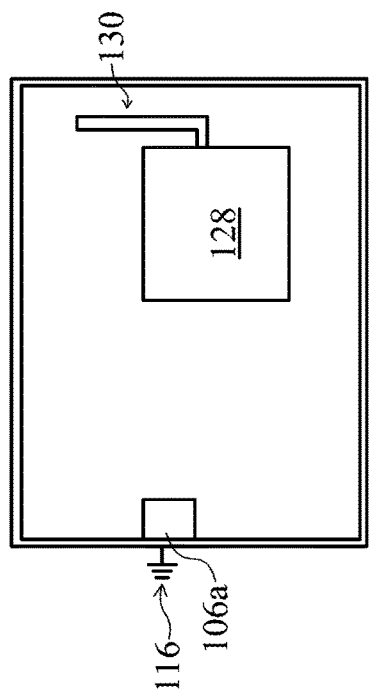
FIGS. 9B, 9C, and 9D are top views showing portions of the packaged semiconductor device shown in FIG. 9A.
Figure 9C:
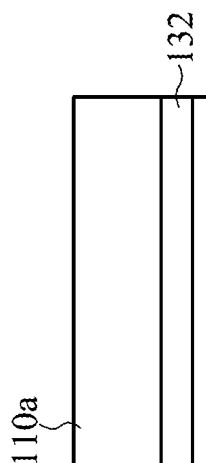
Figure 9D:
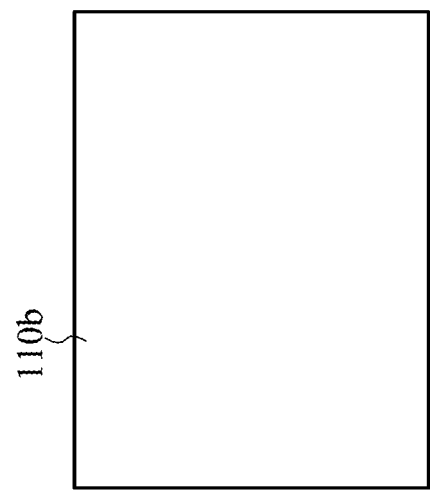

FIG. 9A is a cross-sectional view that illustrates a packaged semiconductor device 100' that includes an antenna 110' in accordance with some embodiments. FIGS. 9B, 9C, and 9D are top views showing portions of the packaged semiconductor device 100 shown in FIG. 9A. FIG. 9B illustrates a top view of a portion of the RDL 108 and surface mount device 128. FIG. 9C illustrates a top view of a shield portion 110*a* of the antenna 110'. FIG. 9D illustrates a top view of an antenna portion 110*b* of the antenna 110'.

The antenna 110' includes a first portion comprising the shield portion 110*a* and a second portion that comprises the antenna portion 110*b*. The shield portion 110*a* is also referred to herein as a shield material 110*a*, and the antenna portion 110*b* is also referred to herein as an antenna 110*b*. The feeding element 130 is disposed proximate (e.g., beneath in FIG. 9A) an aperture 132 in the shield portion 110*a*. The aperture 132 in the shield portion 110*a* may comprise a shape of a slot that runs parallel or perpendicular to the feeding element 130, for example. Thus, a portion of or an entirety of the feeding element 130 is disposed proximate the antenna portion 110*b* through the aperture 132 in the shield portion 110*a*. The shield portion 110*a* is adapted to shield or block other wireless emissions from escaping from portions of the packaged semiconductor device 100' covered by the shield portion 110*a*. Emissions from the feeding element 130 are passed through the aperture 132 in the shield portion 110*a* and excite the antenna portion 110*b*, which antenna portion 110*b* then transmits these emissions, in some embodiments. The shield portion 110*a* of the antenna 110' is grounded as illustrated in FIGS. 9A and 9B, and the antenna portion 110*b* of the antenna 110' is not grounded, in some embodiments.

Thus, in some embodiments, a packaged semiconductor device 100' includes two conformally applied conductive materials that form the shield portion 110*a* and the antenna portion 110*b*. Conductive material comprising the shield portion 110*a* is formed over the second molding material 104*b*, and the conductive material comprising the shield portion 110*a* is patterned with the aperture 132. A third molding material 104*c* is formed over conductive material 110*a*, and a conductive material comprising the antenna portion 110*b* is formed over the third molding material 104*c*.

In some of the embodiments shown in FIGS. 9A through 9D, additional first through-vias 106*a* (not shown) may be included in a packaged semiconductor device 100' within the first molding material 104*a*, because the shield portion 110*a* of the antenna 110' functions as a shield, rather than as an antenna. Additional first through-vias 106a for coupling the shield portion 110a of the antenna 110' to a ground connection 116 is advantageous in some applications, for example, because a shielding property of the shield portion 110a of the antenna 110' is enhanced, and the shielding performance of the shield portion 110a may be improved, in some embodiments. The shield portion 110a is also referred to herein as a shielding material in some embodiments.

FIGS. 10 through 20 are cross-sectional views that illustrate a method of packaging semiconductor devices at various stages of a packaging process in accordance with some embodiments, wherein the packaged semiconductor devices 100 include an antenna 110 in the package. Note that the feeding elements 130 and ground connections are not shown in FIGS. 10 through 20: however, the feeding elements 130 and ground connections previously described herein are formed simultaneously with portions of the RDL 108 and/or through-vias 106a and 106b of the packaged semiconductor devices 100.

Figure 10:
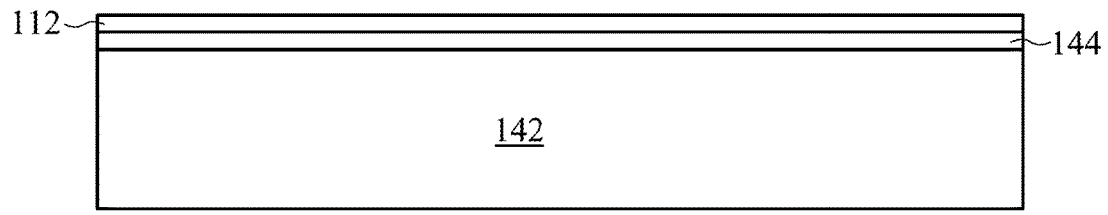
FIGS. 10 through 20 are cross-sectional views that illustrate a method of packaging semiconductor devices at various stages in accordance with some embodiments.

In FIG. 10, to package semiconductor devices 100 that include an antenna 110 in accordance with some embodiments, first, a carrier 142 is provided. The carrier 142 is also referred to herein as a first carrier 142. The carrier 142 may comprise a glass carrier substrate, a ceramic carrier substrate, a wafer such as a semiconductor wafer, a tape, or the like. The carrier 142 is later removed after the packaging process in some embodiments, for example. The carrier 142 may include a release layer (not shown) formed thereon which may comprise a polymer-based material. The release layer may be removed along with the carrier 142 from the overlying structures that will be formed in subsequent processing steps. In some embodiments, the release layer may comprise an epoxy-based thermal-release material, which loses its adhesive property when heated, such as a light-to-heat-conversion (LTHC) release coating. In other embodiments, the release layer may comprise an ultra-violet (UV) glue, which loses its adhesive property when exposed to UV light. The release layer may be dispensed as a liquid and cured, and may be a laminate film laminated onto the carrier 142, or the like.

An adhesive 144 may be formed or dispensed over the release layer on the carrier 142. The adhesive 144 may comprise a die attach film (DAF), a glue, a polymer material, or the like.

An insulating material 112 is formed over the adhesive 144 disposed on the carrier 142. The insulating material 112 comprises a polymer in some embodiments having a thickness of about 50 µm or less, for example. The insulating material 112 may comprise epoxy, polybenzoxazole (PBO), polyimide, benzocyclobutene (BCB), or the like. The insulating material 112 may be formed by any acceptable deposition process, such as spin coating, chemical vapor deposition (CVD), laminating, the like, or a combination thereof.

Figure 11:
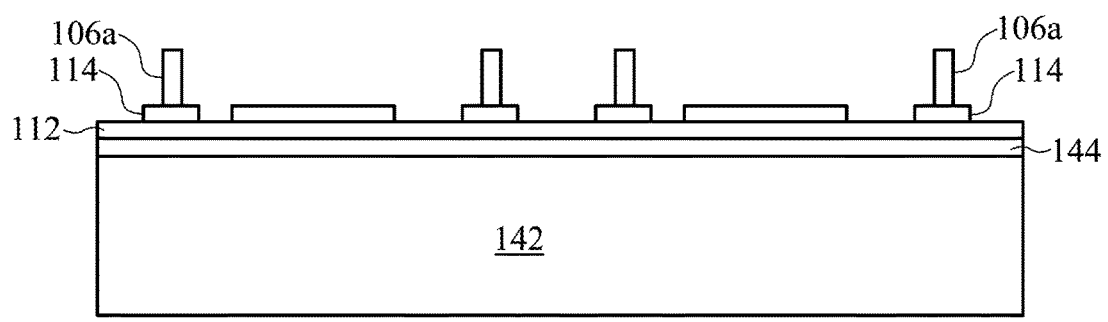

A plurality of contact pads 114 and a plurality of first through-vias 106a are formed over the carrier 142, over the insulating material 112 in some embodiments. In some embodiments, the contact pads 114 are formed within the insulating material 112, as illustrated in FIG. 1, for example. Four contact pads 114 and four first through-vias 106s are shown in FIG. 11; however, hundreds or thousands of contact pads 114 and first through-vias 106a may be included in a packaged semiconductor device 100. The contact pads 114 and/or first through-vias 106a are formed by plating in some embodiments. The contact pads 114 and/or first through-vias 106a may also be formed using subtractive etch techniques, by forming a conductive material over the carrier 142, and patterning the conductive material using a lithography process. The contact pads 114 and first through-vias 106a may also be formed using other methods.

To form the plurality of contact pads 114 and/or first through-vias 106a using a plating process, a seed layer, not shown, is formed over the carrier 142 (e.g., over the release film, adhesive 144, and insulating material 112 disposed over the carrier 142), in some embodiments. The seed layer comprises a metal layer, which may be a single layer or a composite layer comprising a plurality of sub-layers formed of different materials. In some embodiments, the seed layer comprises a titanium layer and a copper layer disposed over the titanium layer. The seed layer may be formed using, for example, sputtering, physical vapor deposition (PVD), or the like.

A sacrificial material, also not shown, is then formed on the seed layer and is patterned. The sacrificial material may comprise a photosensitive material such as a photoresist or an insulator that is photosensitive, as examples. The sacrificial material may be formed by spin coating or the like, and the sacrificial material may be patterned by exposure to light or energy reflected from or transmitted through a patterned lithography mask having a desired pattern thereon. The pattern of the sacrificial material corresponds to the pattern for the contact pads 114 and/or first through-vias 106s to be formed over the carrier 142 in some embodiments. The patterning of the sacrificial material forms openings through the sacrificial material, leaving portions of the seed layer exposed.

A conductive material is formed in the openings of the sacrificial material and on the exposed portions of the seed layer, forming the contact pads 114 and/or the first through-vias 106a. The conductive material is formed by a plating process, such as electroplating or electroless plating, or the like. The conductive material may comprise a metal, such as copper, titanium, tungsten, aluminum, alloys or multiple layers thereof, or the like.

Then, the sacrificial material and portions of the seed layer upon which the conductive material is not formed are removed. The sacrificial material may be removed by an acceptable ashing or stripping process, such as using an oxygen plasma or the like. An etch process may also be used to remove the sacrificial material, e.g., in some embodiments wherein a photosensitive insulating material is used for the sacrificial material. After the sacrificial material is removed, exposed portions of the seed layer are removed, such as by using an acceptable etching process, such as by wet or dry etching. The seed layer that was disposed beneath the sacrificial layer is removed, for example. The remaining portions of the seed layer and conductive material form the contact pads 114 and/or the first through-vias 106a shown in FIG. 11, for example.

The contact pads 114 may be formed using the plating process, and a second sacrificial material comprising a layer of photoresist may be applied and patterned with a pattern for the first through-vias 106a. Portions of the contact pads 114 may be used as a seed layer for the formation of the first through-vias 106a in some embodiments, for example. The second sacrificial material is then removed. Some contact pads 114 include a first through-via 106a coupled thereto, and other contact pads 114 comprise contact pads for integrated circuit dies 102 that will later be formed. Electrical connections between integrated circuit dies 102 may also be formed during the formation of the contact pads 114. The electrical connections may comprise conductive lines or etch runs, for example.

The first through-vias 106*a* may comprise copper or a copper alloy in some embodiments. The first through-vias 106*a* may comprise a diameter of about 190 μm or greater in some embodiments, e.g., in some embodiments wherein the first through-vias 106*a* are used for grounding or as a portion of the feeding element 130, for example. The first through-vias 106*a* may also comprise a diameter of about 190 μm or less in some embodiments, and the first through-vias 106*a* may comprise other materials.

Figure 12:
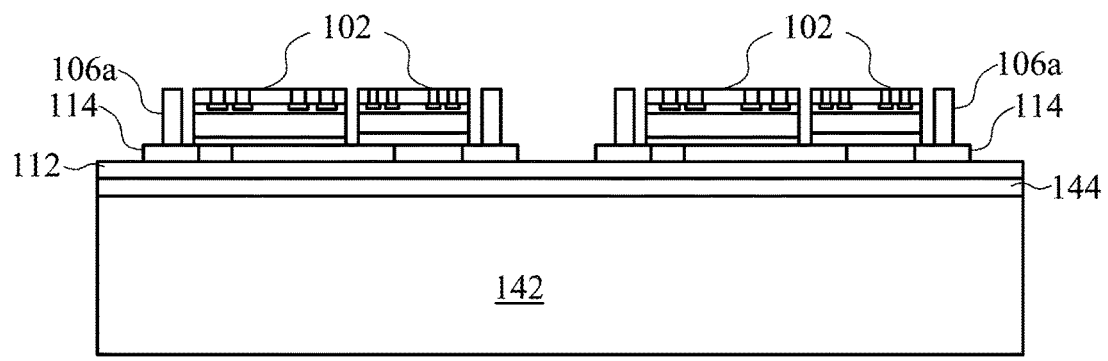

One or more integrated circuit dies 102 are then coupled to the carrier 142 over the insulating material 112, as shown in FIG. 12. The integrated circuit die(s) 102 may be attached to the insulating material 112 by an adhesive or release film disposed on a bottom surface of the integrated circuit dies 102 in some embodiments, for example. The integrated circuit die(s) 102 may be coupled to portions of the electrical connections and/or contact pads 114 formed on the carrier 142.

The integrated circuit die(s) 102 may comprise a substrate having electrical circuitry formed within or thereon. The substrate may comprise, for example, doped or undoped bulk silicon or an active layer of a semiconductor-on-insulator (SOI) substrate. The electrical circuitry of the substrate of the integrated circuit die(s) 102 may be any type of circuitry suitable for a particular application. The integrated circuit die(s) 102 may comprise a logic, memory, processor, or other type of device. As other examples, electrical circuitry formed within or on the substrate of the integrated circuit die(s) 102 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other circuitry may be used as appropriate for a given application. The integrated circuit die(s) 102 typically have been fabricated by forming a plurality of the integrated circuit dies 102 on a semiconductor wafer, and singulating the individual integrated circuit dies 102 along scribe lines.

Figure 13:
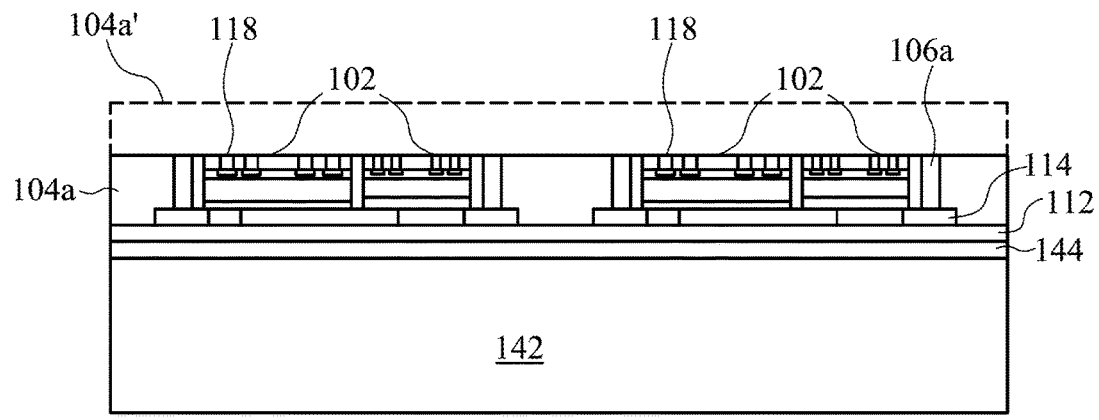

The first molding material 104*a* is disposed over and around the first through-vias 106*a* and the integrated circuit die(s) 102, which is shown in FIG. 13. The first molding material 104*a* encapsulates the first through-vias 106*a* and the integrated circuit die(s) 102 in some embodiments, for example. The first molding material 104*a* may comprise a molding compound comprised of an insulating material, such as an epoxy, a filler material, a stress release agent (SRA), an adhesion promoter, other materials, or combinations thereof, as examples. The first molding material 104*a* may comprise a liquid or gel when applied so that it flows between and around the first through-vias 106*a* and the integrated circuit die(s) 102, in some embodiments. The first molding material 104*a* is then cured or allowed to dry so that it forms a solid. A molding compound clamp may be applied during a curing process and a plasma treatment process of the first molding material 104*a* in some embodiments. In some embodiments, as deposited, the first molding material 104*a* extends over top surfaces of the first through-vias 106*a* and the integrated circuit die(s) 102, as illustrated in phantom in FIG. 13 at 104*a*'. After the first molding material 104*a* is applied, a top portion of the first molding material 104*a* is removed using a planarization process, such as a chemical mechanical polish (CMP) process, a grinding process, an etch process, or combinations thereof, as examples. Other methods may also be used to planarize the first molding material 104*a*. A top portion of the first through-vias 106*a* and/or the integrated circuit die(s) 102 may also be removed during the planarization process for the first molding material 104*a*. In some embodiments, an amount of the first molding material 104*a* applied may be controlled so that top surfaces of the first through-vias 106*a* and integrated circuit die(s) 102 are exposed. Other methods may also be used to form the first molding material 104*a*.

Figure 14:
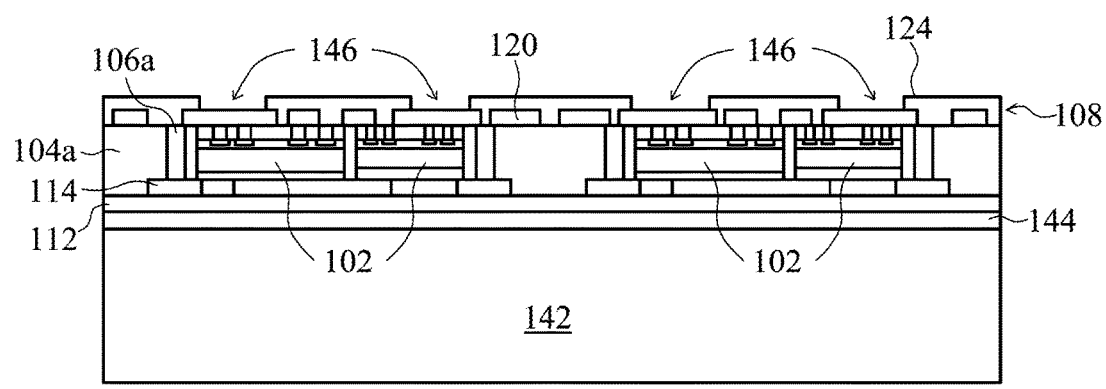

Next, an RDL 108 comprising an interconnect structure is formed over the first molding material 104*a*, the integrated circuit die(s) 102, and the first through-vias 106*a*, as shown in FIG. 14. One or more conductive material layers and insulating material layers of the RDL 108 are sequentially formed over the first molding material 104*a* in some embodiments. For example, the RDL 108 may be formed over the planarized first molding material 104*a*, the first through-vias 106*a*, and the integrated circuit die(s) 104, as shown in FIG. 14. Conductive features of the RDL 108 formed within the insulating material layers 124 of the RDL 108 (see also FIG. 1) may comprise conductive lines 120, conductive vias 122 (not shown in FIG. 14; see FIG. 1), landing pads, and/or other types of features that may comprise similar conductive materials and/or formation methods as described for the first through-vias 106*a*, for example.

The RDL 108 may include fan-out wiring wherein landing pads or contact pads of the RDL 108 are spaced out farther apart and have a larger footprint than contact pads 118 on the integrated circuit die(s) 102, for example. The RDL 108 may also comprise other types of wiring, such as a post-passivation interconnect (PPI) or other types of interconnect structures. The RDL 108 is formed using a wafer level package (WLP) process in some embodiments, for example. The RDL 108 may include one or more conductive line 120 layers, for example. The RDL 108 may include zero or one or more conductive via 122 layers. Some of the conductive lines 120 and/or conductive vias 122 of the RDL 108 may be coupled to contact pads 118 of the integrated circuit die(s) 102 and/or the first through-vias 106*a*.

The insulating material layer or layers 124 (see also FIG. 1) are formed around the conductive lines 120 and the conductive vias 122, forming the RDL 108. The insulating material layers 124 may comprise a polymer, such as PBO, polyimide, BCB, or the like. In some embodiments, the insulating material layer(s) 124 may comprise a nitride such as silicon nitride; an oxide such as silicon oxide, phosphosilicate glass (PSG), borosilicate glass (BSG), boron-doped phosphosilicate glass (BPSG); combinations or multiple layers thereof; or the like. The insulating material layer(s) 124 may be formed by any acceptable deposition process, such as spin coating, CVD, laminating, the like, or a combination thereof.

In some embodiments, the conductive lines 120, conductive vias 122, and other conductive features of the RDL 108 are formed using a plating process. For example, one or more insulating material layers 124 are formed over the first molding material 104*a*, first through-vias 106*a*, and integrated circuit die(s) 102, and the one or more insulating material layers 124 are patterned using lithography. Using a single damascene process, a seed layer may be formed and sacrificial material may be formed as described for the first through-vias 106a, and a conductive material may be plated over the seed layer through the patterned sacrificial material to form the conductive vias 122, conductive lines 120, and/or other conductive features of the RDL 108. The sacrificial material and exposed seed layer are then removed. A conductive via 122 layer and conductive line 120 layer may simultaneously be plated over a seed layer using a dual damascene process in some embodiments, as another example. One or more of the conductive via 122 layers and conductive line 120 layers may be formed using a damascene method within one or more insulating material layers 124, for example.

The process(es) described herein used to form the conductive features of the RDL 108 may be repeated for additional conductive via layers and conductive line layers, if any are included in the RDL 108. The conductive vias 122 may interconnect and electrically couple the various conductive lines 120 and other metallization patterns in the various conductive feature layers of the RDL 108.

The conductive lines 120 and conductive vias 122 of the RDL 108 may comprise a thin layer, e.g., comprising a thickness of about 2 μm to about 3 μm or less, of titanium or other seed material that is formed using a sputtering process, and a layer of copper, a copper alloy, or other metal that is electro-plated over the layer of titanium, in some embodiments. In other embodiments, the conductive lines 120 and conductive vias 122 may comprise a multi-layered structure, such as a copper layer coated with electro-less nickel or electro-less palladium immersion gold (ENEPIG), which includes a nickel layer, a palladium layer on the nickel layer, and a gold layer on the palladium layer. The gold layer may be formed using immersion plating. The conductive lines 120 and conductive vias 122 of the RDL 108 may also comprise other materials, dimensions, and formation methods. The insulating material layers 124 may be formed or disposed around the conductive lines 120 and conductive vias 122.

In some embodiments, the conductive lines 120 and conductive vias 122 may be deposited and patterned using a lithography process. For example, a conductive material may be formed as a blanket coating and then etched using a lithography process to pattern the conductive lines 120 and conductive vias 122. The conductive lines 120 and conductive vias 122 may be formed using subtractive etch processes, and the insulating material layers 124 are then formed around the conductive lines 120 and the conductive vias 122, forming the RDL 108.

After the RDL 108 is formed, openings 146 are formed over portions of the insulating material 124 of the RDL 108, which is also shown in FIG. 14. The openings 146 may be formed using a lithography process, for example. A connector 129 material is formed in the openings 146 that are coupled to conductive portions of the RDL 108. The connector 129 material may comprise a eutectic material in some embodiments, such as a solder paste.

Figure 15:
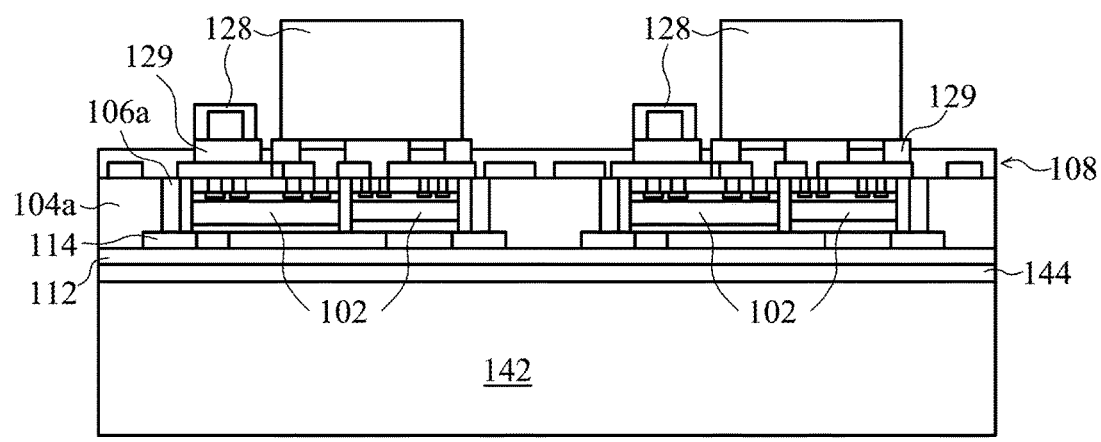

A plurality of surface mount devices 128 is coupled to the connector 129 material, as shown in FIG. 15. The surface mount devices 128 may be coupled to the RDL 108 using a pick-and-place machine or other automated equipment, for example. A eutectic material of the connector 129 material may be heated to reflow the eutectic material. When the eutectic material cools, the surface mount devices 128 are mechanically and electrically coupled to conductive portions of the RDL 108, for example.

The surface mount devices 128 may comprise passive components in some embodiments, such as resistors, capacitors, or inductors. The surface mount devices 128 may also comprise other types of devices, such as sensors, crystals, oscillators, and the like. In some embodiments, the surface mount devices 128 may include sensors adapted to detect a heart rate, temperature, or other detectable functions, e.g., in some embodiments wherein an aperture 132 is included in the antenna 110 or 110', for example. The surface mount devices 128 may comprise the same height or different heights, as illustrated in FIG. 15.

Figure 16:
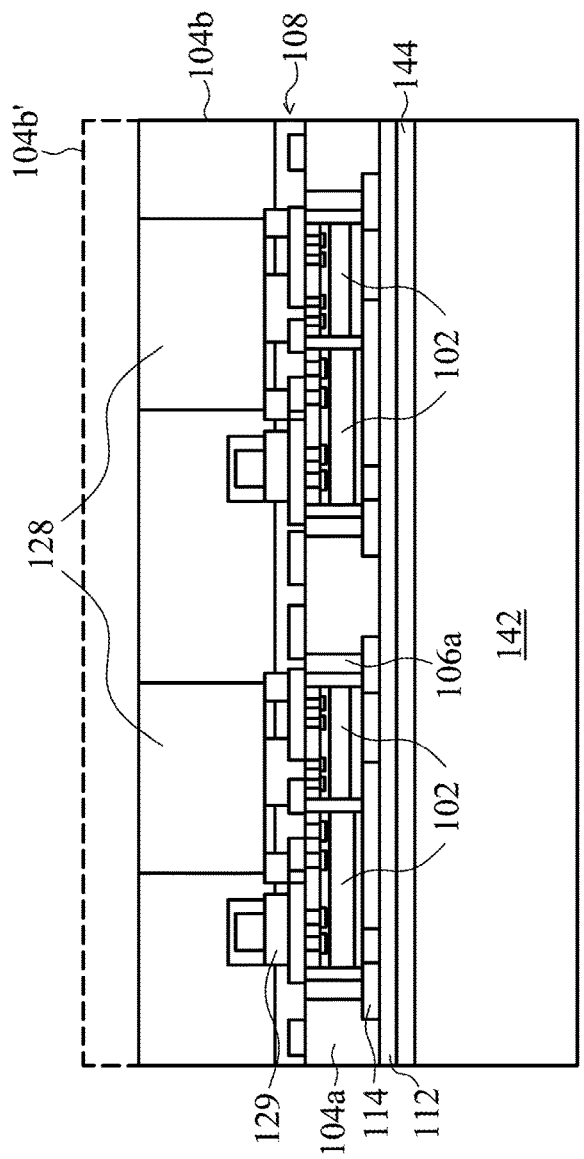

A second molding material 104b is formed over the surface mount devices 128 and exposed portions of the RDL 108, as shown in FIG. 16. The second molding material 104b may comprise similar materials and application methods as described for the first molding material 104a, for example. A top surface of the second molding material 104b may extend over the surface mount devices 128 after forming the second molding material 104b, as illustrated in phantom at 104b'. The top surface of the second molding material 104b may be planarized to reduce the height of the second molding material 104b, which is also shown in FIG. 16.

Note that the second through-vias 106b are not illustrated in FIGS. 14 through 20. In some embodiments wherein the second through-vias 106b are included in the packaged semiconductor devices 100 or 100', the second through-vias 106b may be formed using a plating process or deposition and patterning process before or after the surface mount devices 128 are attached, as shown in FIG. 15. The second molding material 104b is then formed around the surface mount devices 128 and the second through-vias 106b. The second through-vias 106b may also be formed after the second molding material 104b is formed, by patterning the second molding material 104b and forming the second through-vias 106b within the second molding material 104b using a plating or deposition process. The second through-vias 106b may comprise similar materials and formation methods as described for the first through-vias 106a, for example.

Note also that the feeding elements 130 are not labeled in some of the embodiments illustrated in FIGS. 10 through 20. The feeding elements 130 of the packaged semiconductor devices 100 are disposed within the first molding material 106a, a portion of the RDL 108, and/or the second molding material 106b, as previously described herein.

Figure 17:
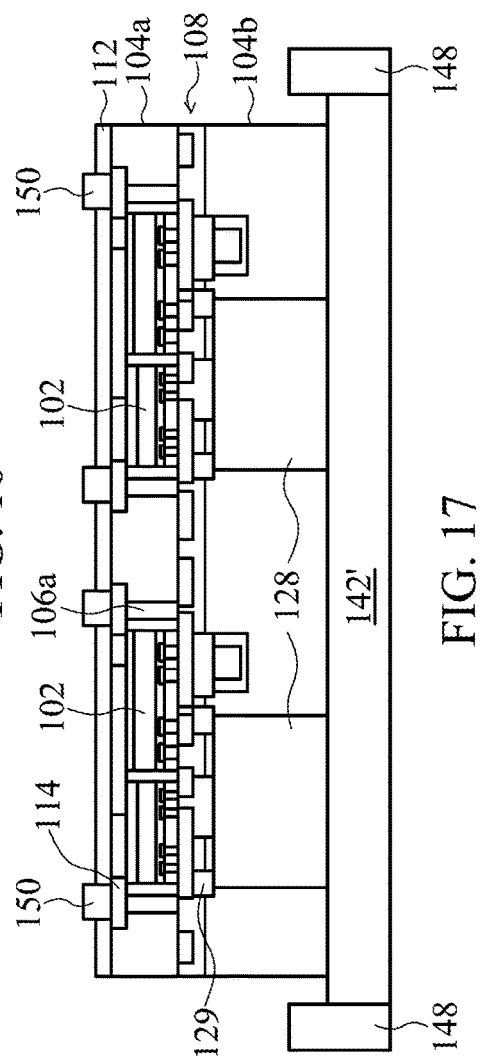

A second carrier 142' is coupled to top surfaces of the surface mount devices 128, the first carrier 142 is removed, and the device is inverted, as shown in FIG. 17. The second carrier 142' may comprise a tape carrier that includes a support 148 which may comprise a frame, for example. The insulating material 112 is patterned in some embodiments with a plurality of openings, and a eutectic material 150 such as a solder paste is formed over contact pads 114 that are exposed in the openings in the insulating material 112, as illustrated in FIG. 17.

Figures 18, 19:
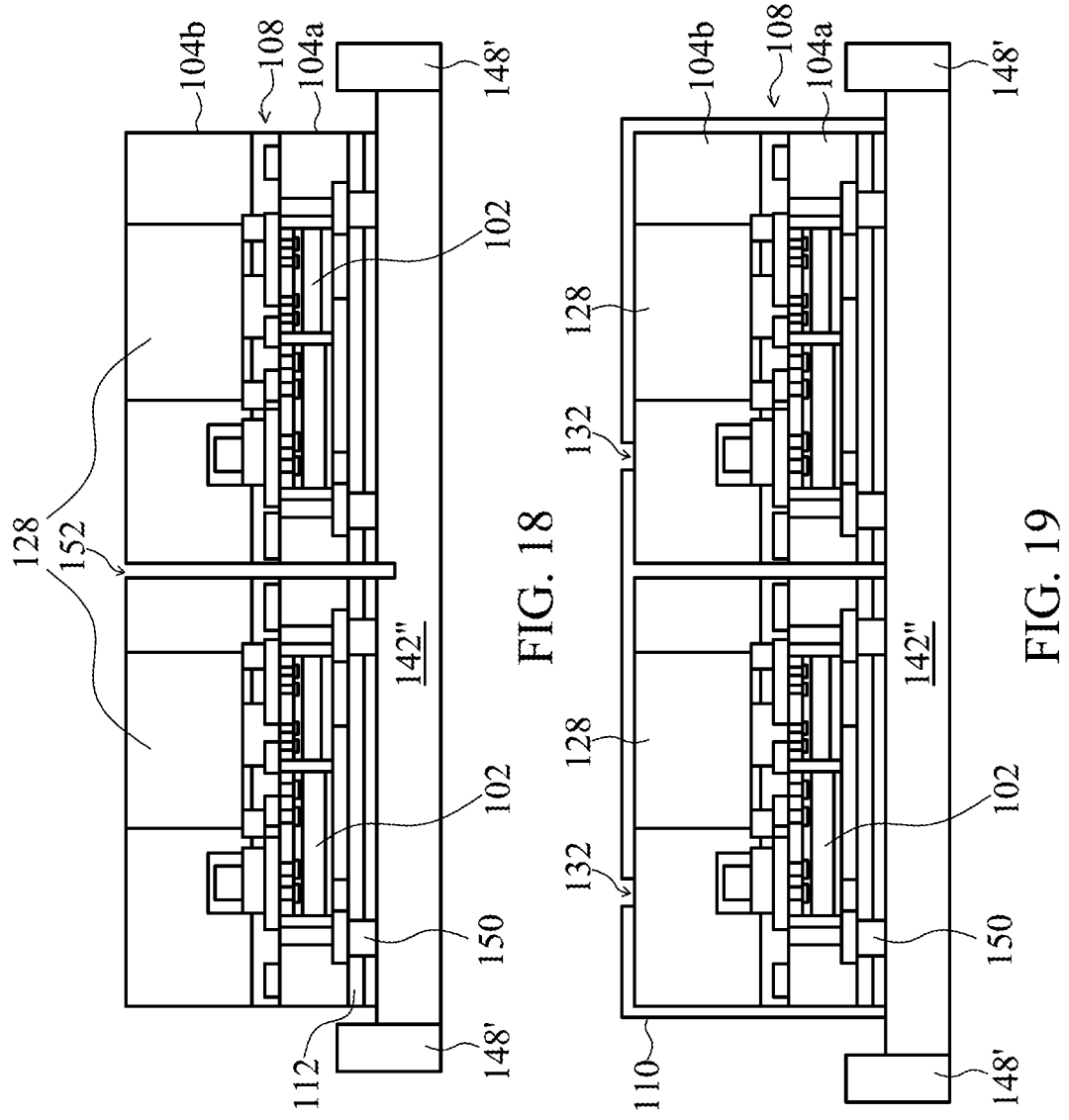

A third carrier 142" is then coupled to the eutectic material 150, as shown in FIG. 18, the device is inverted, and the second carrier 142' is removed. The third carrier 142" may also comprise a tape carrier that includes a support 148' which may comprise a frame, for example. A singulation process is then performed using a die saw or other method or device along singulation lines 152 disposed between adjacent packaged semiconductor devices, also shown in FIG. 18.

In FIG. 19, a conductive material 110 is formed over the second molding material 104b. The conductive material 110 comprises a metal that is conformally formed in some embodiments. In some embodiments, the conductive material 110 may comprise a material such as copper, aluminum, silver, stainless steel, titanium, gold, other metals, or combinations or multiple layers thereof, as examples. The conductive material 110 may be formed by PVD, CVD, sputtering, spraying, or other methods. The conductive material 110 may comprise a thickness of about 4 µm or greater in some embodiments. In some embodiments, the conductive material 110 comprises a thickness of about 4 µm to about 100 µm, for example. The conductive material 110 may also comprise other materials, dimensions, and formation methods. The conductive material 110 comprises an antenna in some embodiments; thus, the conductive material 110 is also referred to herein as an antenna 110 after its formation and also after a patterning process for the conductive material 110, in some embodiments.

The conductive material 110 is patterned using a laser or other device or method to form apertures 132 in some embodiments, which is also illustrated in FIG. 19. In some embodiments, the conductive material 110 is not patterned.

Figure 20:
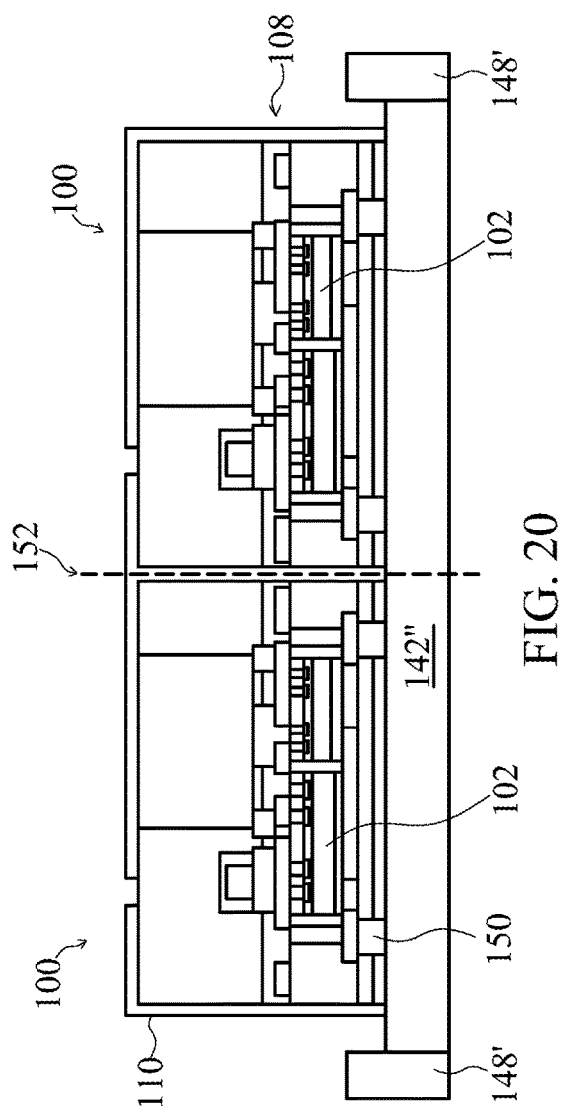

In FIG. 20, a plurality of the packaged semiconductor devices 100 is singulated along scribe lines 152 to form separated packaged semiconductor devices 100. The conductive material 110 is singulated along the scribe lines 152, for example, in some embodiments. The third carrier 142" is then removed.

Figure 21:
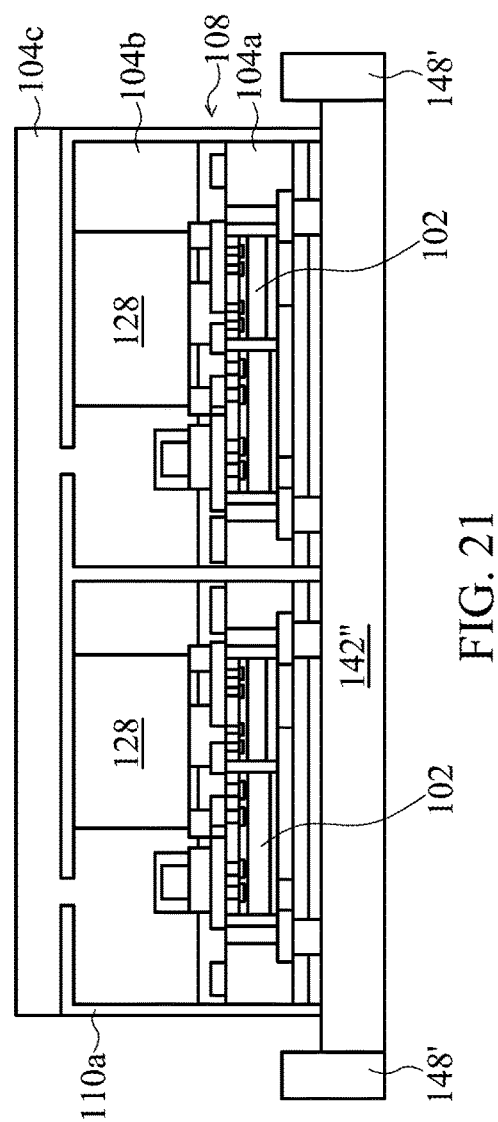

To form the packaged semiconductor devices 100' shown in FIGS. 9A through 9D, rather than singulating the conductive material 110 as shown in FIG. 20, a third molding material 104c is formed over the top surface of the conductive material 110a, as shown in FIGS. 21 through 23, which are cross-sectional views that illustrate a method of packaging semiconductor devices 100' at various stages in accordance with some embodiments. The third molding material 104c may comprise similar materials and formation methods as the first molding material 104a, for example. The third molding material 104c comprises a thickness of about 200 µm or greater in some embodiments. The third molding material 104c may also comprise other dimensions, such as about 200 µm or less, for example.

The conductive material 110b of the antenna portion 110b of the antenna 110' is formed over the third molding material 104c, as shown in FIG. 22. The shield portion 110a and the antenna portion 110b of the antenna 110' may comprise similar materials, dimensions, and formations as described for antenna 110 shown in the previous embodiments, for example. The conductive material 110b of the antenna portion 110b of the antenna 110', the third molding material 104c, and the conductive material 110a of the shield portion 110a of the antenna 110' are then singulated along singulation lines 152, forming a plurality of the packaged semiconductor devices 100', as shown in FIG. 23. The third carrier 142" is then removed.

Figure 24:
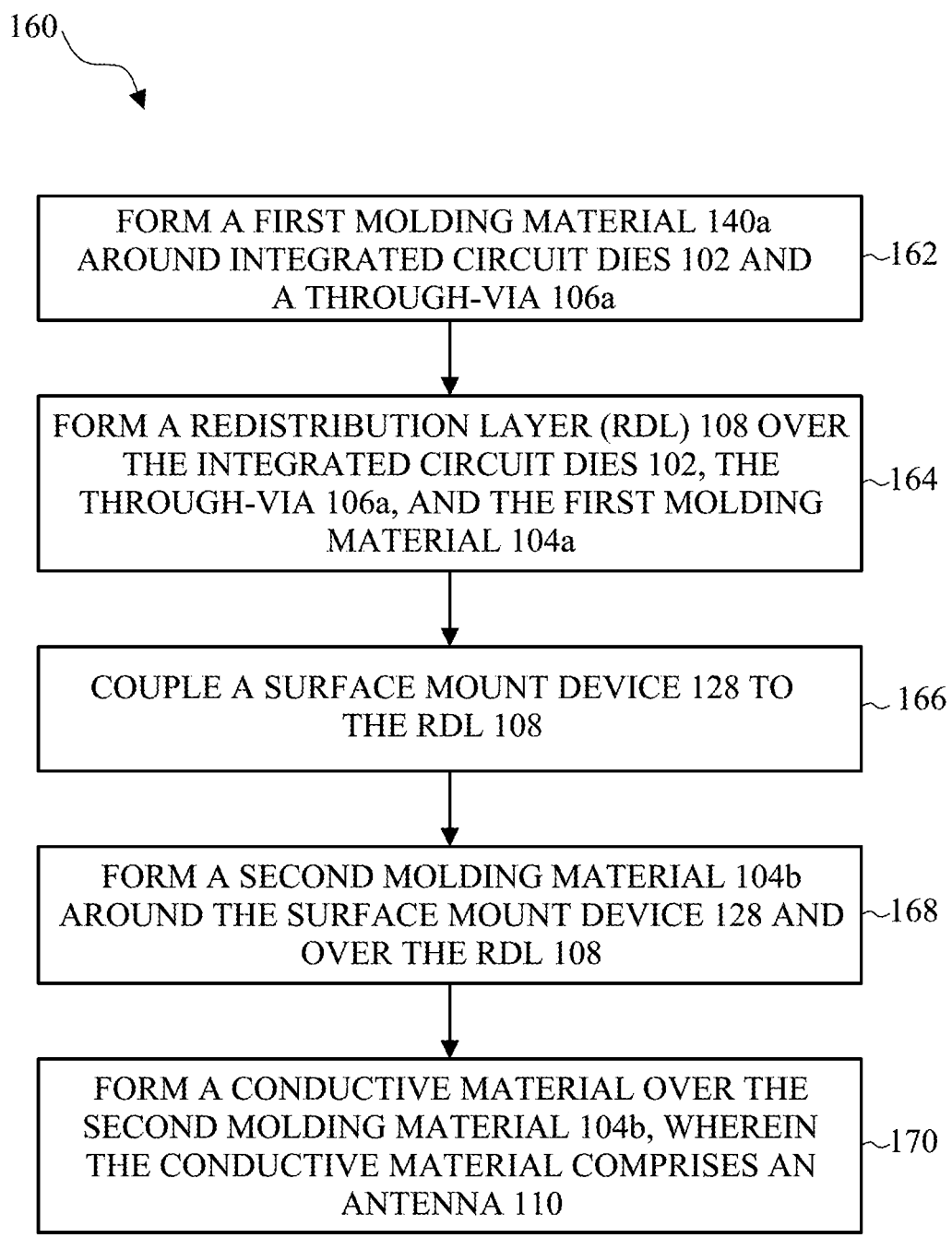
FIG. 24 is a flow chart that illustrates a method of packaging a semiconductor device in accordance with some embodiments of the present disclosure.

FIG. 24 is a flow chart 160 that illustrates a method of packaging a semiconductor device in accordance with some embodiments of the present disclosure. In step 162, a first molding material 104a is formed around integrated circuit dies 102 and a through-via 106a. In step 164, an RDL 108 is formed over the integrated circuit dies 102, the through-via 106a, and the first molding material 104a. In step 166, a surface mount device 128 is coupled to the RDL 108. In step 168, a second molding material 104b is formed around the surface mount device 128 and over the RDL 108. In step 170, a conductive material is formed over the second molding material 104b. The conductive material comprises an antenna 110.

Some embodiments of the present disclosure include packaged semiconductor devices that include antennas. Some embodiments include methods of forming and packaging semiconductor devices.

Advantages of some embodiments of the present disclosure include providing packaged semiconductor devices wherein antennas are included in the packages. The antenna conductive material is formed using conformal deposition processes of metals, which avoids a need for costly metal stamping processes, advantageously. Conformally coating on the antenna conductive materials also reduces the package height and reduces packaging costs.

A target frequency of the antennas is adjustable by adjusting the feeding element structure and/or grounding structure. In some embodiments, at least one side of the conformal coating comprising the antenna structure is grounded. Flexibility of antenna designs for packaged semiconductor devices is also increased.

Several embodiments are disclosed with a variety of configurations of the antennas and various components and elements of the packaged semiconductor devices being described herein. The feeding elements may be directly attached or coupled to the antennas, or the feeding elements may be placed proximate yet not abutting the antennas. A clear zone may be formed proximate the feeding elements to prevent or reduce interference with transmission of the antenna.

The antenna conductive material may be patterned or unpatterned. Grounding of the antenna may be accomplished through an RDL or through-vias of the packaged semiconductor devices, or both. The antennas may be formed in the packaged semiconductor devices without an increase in area penalty. The antenna designs have increased flexibility by utilizing the antennas in a three-dimension (3D) package design in some embodiments. Furthermore, the methods and structures described herein are easily implementable into existing interconnect structures, through-via structures, and packaging process flows and structures.

In some embodiments, a packaged semiconductor device includes an integrated circuit die, a first molding material disposed around the integrated circuit die, and a through-via disposed within the first molding material. A first side of an RDL is coupled to the integrated circuit die, the through-via, and the first molding material. A second molding material is disposed over a second side of the RDL, the second side of the RDL being opposite the first side of the RDL. An antenna is disposed over the second molding material.

In some embodiments, a packaged semiconductor device includes a plurality of integrated circuit dies, a first molding material disposed around the plurality of integrated circuit dies, and a first through-via disposed within the first molding material. A first side of an RDL is coupled to the plurality of integrated circuit dies and the first through-via. A plurality of surface mount devices is coupled to a second side of the RDL, the second side of the RDL being opposite the first side of the RDL. A second molding material is disposed over the second side of the RDL and around the plurality of surface mount devices. An antenna is disposed over the second molding material. The first through-via comprises a ground connection for the antenna. A portion of the RDL or a second through-via in the second molding material comprises a feeding element for the antenna.

In some embodiments, a method of packaging a semiconductor device includes forming a first molding material around a plurality of integrated circuit dies and a through-via, and forming an RDL over the plurality of integrated circuit dies, the through-via, and the first molding material. The method includes coupling a surface mount device to the RDL, and forming a second molding material around the surface mount device and over the RDL. A conductive material is formed over the second molding material. The conductive material comprises an antenna.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaged semiconductor device comprising:
a plurality of integrated circuit dies;
a first molding material disposed around the plurality of integrated circuit dies;
a first through-via disposed within the first molding material;
a first side of a redistribution layer (RDL) coupled to the plurality of integrated circuit dies and the first through-via;
a plurality of surface mount devices coupled to a second side of the RDL, the second side of the RDL being opposite the first side of the RDL;
a second molding material disposed over the second side of the RDL and around the plurality of surface mount devices; and
an antenna disposed over the second molding material, wherein the antenna extends from an outer edge of the second molding material to an opposite outer edge of the second molding material, wherein the first through-via comprises a ground connection for the antenna, and wherein a portion of the RDL or a second through-via in the second molding material comprises a feeding element for the antenna.

2. The packaged semiconductor device according to claim 1, further comprising a clear zone proximate the feeding element for the antenna.

3. The packaged semiconductor device according to claim 2, wherein interconnect routing of the RDL, the plurality of integrated circuit dies, the plurality of surface mount devices, the first through-via, or the second through-via are not disposed in the clear zone.

4. The packaged semiconductor device according to claim 1, wherein a first side of the plurality of integrated circuit dies and the first through-via is coupled to the RDL, and wherein the packaged semiconductor device further comprises an insulating material coupled to a second side of the plurality of integrated circuit dies and the first through-via, the second side of the plurality of integrated circuit dies and the first through-via being opposite the first side of the integrated circuit dies and the first through-via.

5. The packaged semiconductor device according to claim 4, wherein the insulating material comprises a polymer.

6. The packaged semiconductor device according to claim 4, wherein the insulating material comprises a ground contact disposed therein or thereon, and wherein the first through-via is coupled to the ground contact.

7. The packaged semiconductor device according to claim 1, further comprising a shielding material disposed between the antenna and the plurality of surface mount devices, and a third molding material disposed between the shielding material and the antenna.

8. A packaged semiconductor device comprising:
an integrated circuit die;
a first molding material disposed around the integrated circuit die;
a first through-via disposed within the first molding material;
a first side of a redistribution layer (RDL) coupled to the integrated circuit die, the first through-via, and the first molding material;
a second molding material over a second side of the RDL, the second side of the RDL being opposite the first side of the RDL;
one or more surface mount devices encapsulated within the second molding material;
at least one second through-via extending through the second molding material; and
an antenna disposed over the second molding material and connected to the at least one second through-via, wherein the antenna is disposed over a sidewall of the first molding material, and wherein the RDL is coupled to a portion of the antenna disposed over the sidewall of the first molding material.

9. The packaged semiconductor device according to claim 8, wherein the first through-via comprises a ground connection for the antenna.

10. The packaged semiconductor device according to claim 9, wherein the antenna is disposed over a surface of the second molding material, wherein the second through-via is coupled to a portion of the antenna disposed over the surface of the second molding material, and wherein the second through-via is coupled to the first through-via by a portion of the RDL.

11. The packaged semiconductor device according to claim 8, wherein a portion of the RDL, the second through-via in the second molding material, or a portion of the RDL and a second through-via in the second molding material comprises a feeding element for the antenna.

12. The packaged semiconductor device according to claim 8, wherein the antenna is patterned.

13. The packaged semiconductor device according to claim 8, wherein the antenna is unpatterned.

14. A semiconductor device comprising:
a first molding material around a plurality of integrated circuit dies and a through-via;
a redistribution layer (RDL) over the plurality of integrated circuit dies, the through-via, and the first molding material;
a surface mount device coupled to the RDL;
a second molding material around the surface mount device and over the RDL;
a second through-via extending through the second molding material; and
a conductive material over the second molding material and in electrical connection with the through-via, wherein the conductive material comprises an antenna, and wherein the conductive material comprises an aperture formed therein.

15. The semiconductor device according to claim 14, wherein the conductive material is in physical contact with the RDL.

16. The semiconductor device according to claim 14, wherein the conductive material has a constant thickness.

17. The semiconductor device according to claim 14, wherein the RDL comprises an interconnect structure comprising fan-out wiring.

18. The semiconductor device according to claim 14, further comprising an insulating material located adjacent to a side of one of the plurality of integrated circuit dies opposite the RDL.

19. The semiconductor device according to claim 18, further comprising:
   an opening in the insulating material; and
   a contact pad within the openings over the through-via.

20. The semiconductor device according to claim 14, wherein the aperture is T-shaped.

* * * * *